(12) United States Patent
Ji et al.

(10) Patent No.: US 10,062,499 B2
(45) Date of Patent: Aug. 28, 2018

(54) POWER MODULE AND MAGNETIC COMPONENT THEREOF

(71) Applicant: DELTA ELECTRONICS, INC., Taoyuan (TW)

(72) Inventors: Pengkai Ji, Shanghai (CN); Jinping Zhou, Shanghai (CN); Shouyu Hong, Shanghai (JP); Tao Wang, Shanghai (CN); Jianhong Zeng, Shanghai (CN); Zhangnan Xin, Shanghai (JP)

(73) Assignee: DELTA ELECTRONICS, INC., Taoyuan (TW)

( * ) Notice: Subject to any disclaimer, the term of this patent is extended or adjusted under 35 U.S.C. 154(b) by 0 days.

(21) Appl. No.: 15/784,864

(22) Filed: Oct. 16, 2017

(65) Prior Publication Data
US 2018/0122562 A1 May 3, 2018

(30) Foreign Application Priority Data

Oct. 28, 2016 (CN) .......................... 2016 1 0969989
May 5, 2017 (CN) .......................... 2017 1 0312684

(51) Int. Cl.
*H01F 27/29* (2006.01)
*H05K 1/18* (2006.01)
(Continued)

(52) U.S. Cl.
CPC ............ *H01F 27/29* (2013.01); *H01F 27/24* (2013.01); *H01L 27/02* (2013.01); *H05K 1/111* (2013.01); *H05K 1/115* (2013.01); *H05K 1/181* (2013.01); *H05K 1/185* (2013.01); *H05K 2201/1003* (2013.01)

(58) Field of Classification Search
CPC .......... H01F 27/29; H01F 27/24; H01F 27/28; H01F 17/04; H01F 17/043; H01L 27/02; H05K 1/11; H05K 1/115; H05K 1/181; H05K 1/185; H05K 2201/1008
See application file for complete search history.

(56) References Cited

U.S. PATENT DOCUMENTS 7,289,329 B2 * 10/2007 Chen .................... H01F 27/2804
165/185
2004/0174241 A1 * 9/2004 He ....................... H01F 27/2804
336/200

(Continued)

*Primary Examiner* — Adolf Berhane
(74) *Attorney, Agent, or Firm* — Kirton McConkie; Evan R. Witt

(57) ABSTRACT

A power module including a power device and a magnetic component is provided. The magnetic component is stacked with the power device and a vertical projection of the magnetic component is at least partially overlapping with the power device. The magnetic component includes a magnetic core and a winding set. The magnetic core includes a first surface, a second surface and at least one window. The window is located between the first surface and the second surface, and includes a passing-through axis vertical to a surface of the power device, where at least one leading pin or pad is disposed on the surface of the power device. The winding set includes at least one winding portion. The winding portion passes through the window and electrically connected to the power device. Each winding set and the magnetic core are configured to form an inductor, and the winding set is preformed.

35 Claims, 39 Drawing Sheets

(51) Int. Cl.
  *H05K 1/11* (2006.01)
  *H01F 27/24* (2006.01)
  *H01L 27/02* (2006.01)

(56) References Cited

U.S. PATENT DOCUMENTS

| | | | |
|---|---|---|---|
| 2009/0167477 A1* | 7/2009 | Feng | H01F 17/0033 336/200 |
| 2010/0007451 A1* | 1/2010 | Yan | H01F 17/043 336/90 |
| 2015/0194254 A1* | 7/2015 | Dai | H01F 3/10 336/220 |
| 2016/0181001 A1* | 6/2016 | Doljack | H01F 27/24 336/221 |
| 2017/0104419 A1* | 4/2017 | Zeng | H01F 38/14 |
| 2017/0141695 A1* | 5/2017 | Zeng | H01F 27/40 |
| 2017/0301961 A1* | 10/2017 | Kim | H01M 10/425 |
| 2018/0124922 A1* | 5/2018 | Ji | H05K 1/18 |

\* cited by examiner

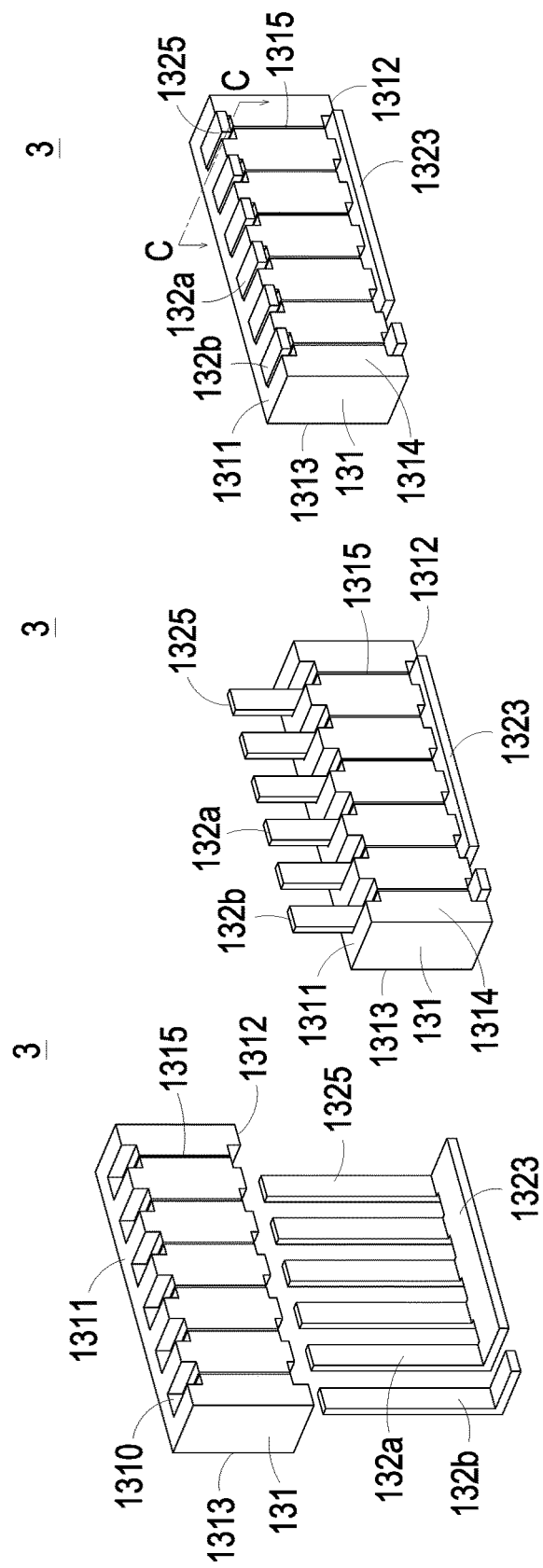

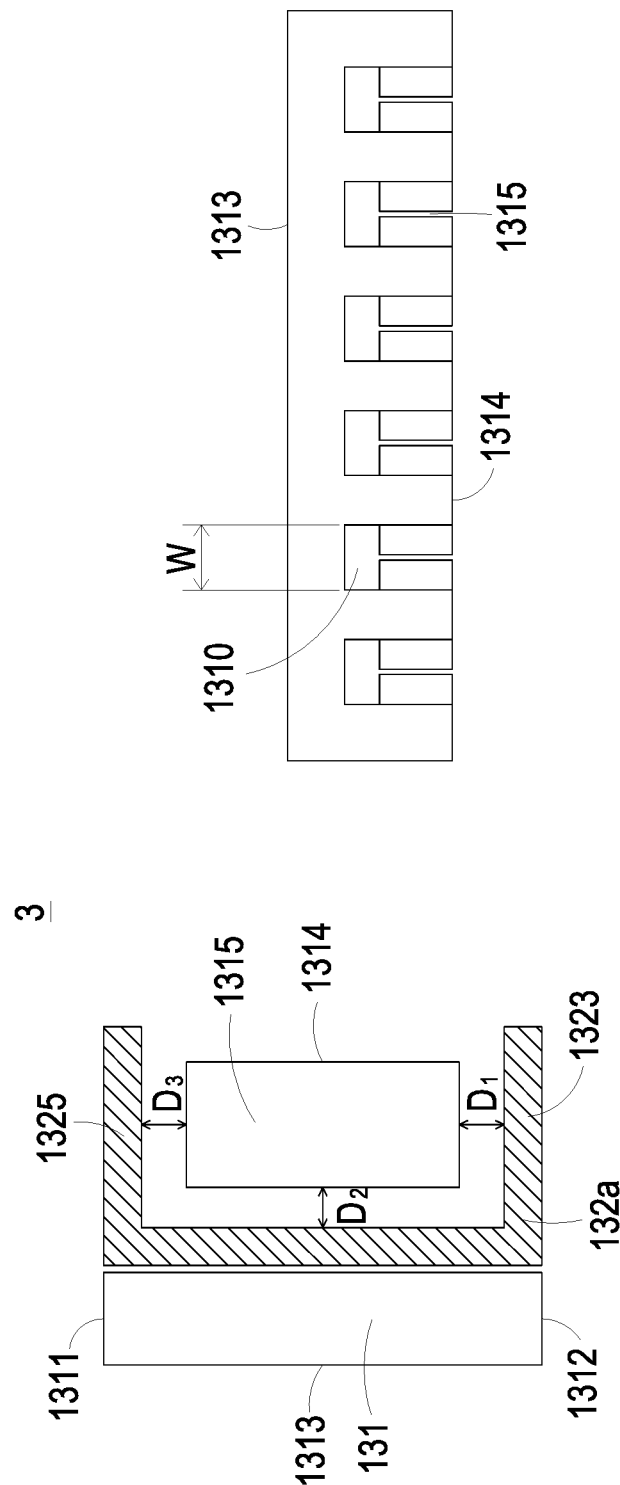

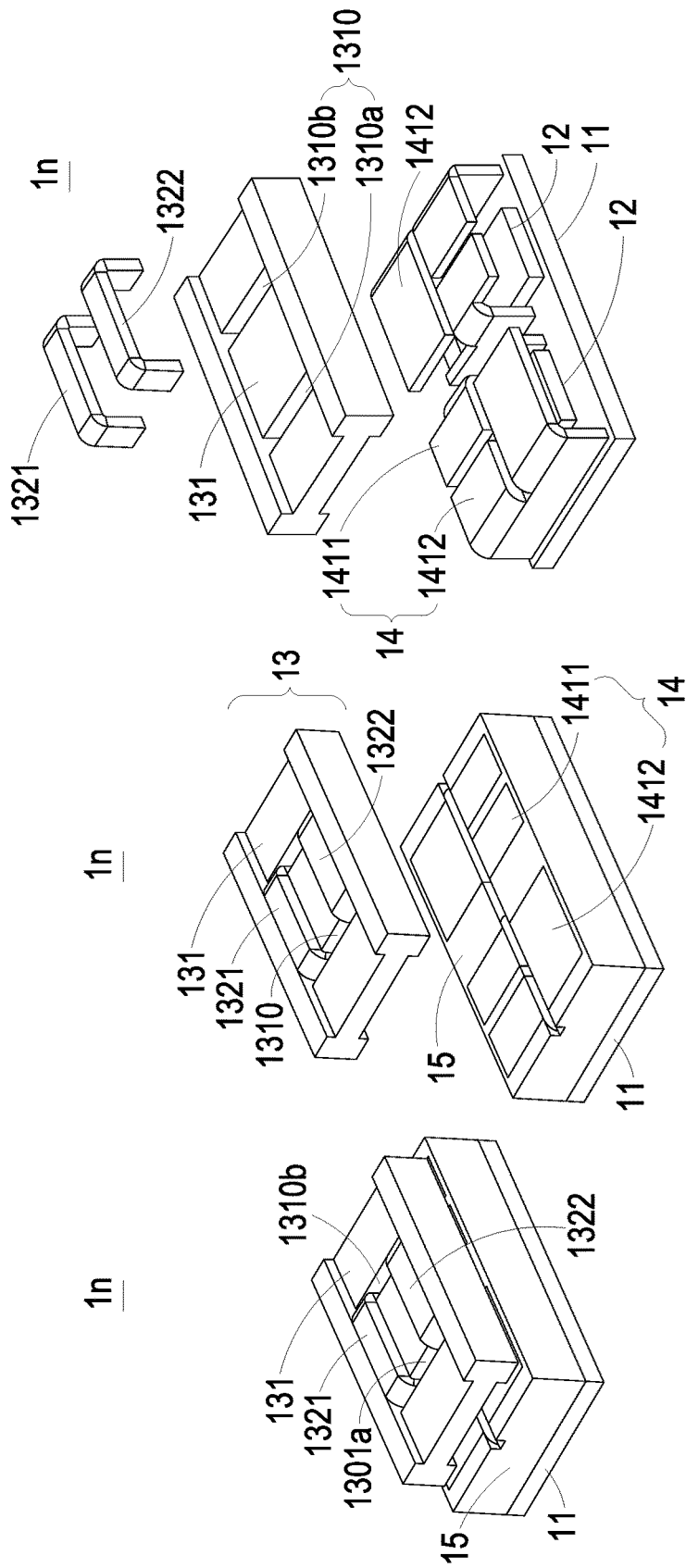

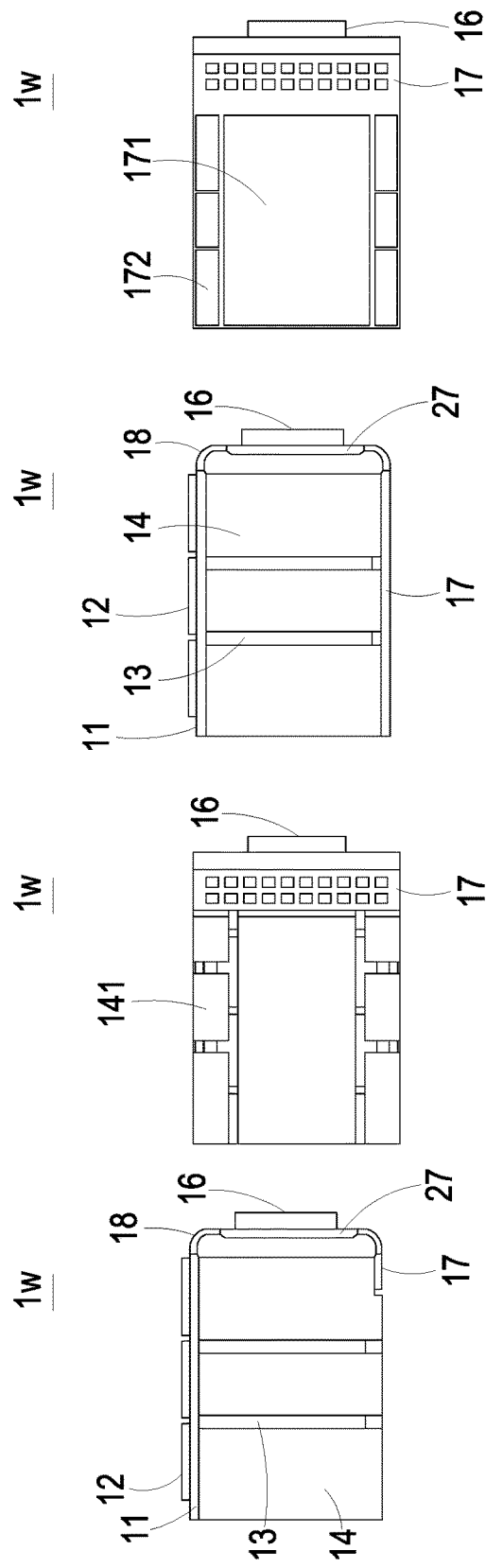

POWER MODULE AND MAGNETIC COMPONENT THEREOF

FIELD OF THE INVENTION

The present invention relates to a power module, and more particularly to a power module having high power density and a magnetic component thereof.

BACKGROUND OF THE INVENTION

In a conventional power module integration, there are various power devices and magnetic components placed horizontally on a circuit substrate, so that it makes the footprint of the power module large and occupies much more space on the client circuit board. In addition, its power transmission trace is longer, and the longer trace causes greater impedance. Consequently, the efficiency of the power module is influenced.

Some power modules include the power devices and the magnetic components stacked together on a circuit substrate, but the window-passing direction of the magnetic components is still parallel to the circuit substrate. The connection traces between the windings of the magnetic components and the power devices are still long and the power loss can't be reduced.

With the rapid development of cloud computing, network technology and various intelligent terminals, such apparatuses place more demands on power modules, such as high efficiency, high power density, and high cost performance. The power of various data processing and computing integrated circuit becomes larger, and the requirement of computing capacity or data processing ability is getting higher. However, the structures of the conventional power modules can't meet these requirements.

Therefore, there is a need of providing a power module and a magnetic component thereof to overcome the above drawbacks.

SUMMARY OF THE INVENTION

An object of the present invention is to provide a power module and a magnetic component thereof. The magnetic component includes a window passing through the top surface and the bottom surface. By stacking the magnetic component and the power device of the power module together, the vertical projection of the top surface and the bottom surface of the magnetic core of the magnetic component is of at least partially overlapping with the power device. Consequently, the magnetic component and the power device can be stacked together and assembled with the shortest connecting trace, so as to reduce the entire volume of the power module, increase the power density, and provide a competitive power module with high conversion efficiency.

Another object of the present invention is to provide a power module having high power density. The magnetic component of the power module includes a window passing through the top surface and the bottom surface. The magnetic component further includes at least two integrated windings, which pass through the widow of the magnetic core and are electrically connected to the power device with the short connecting distance. The power device is stacked together with the magnetic component. Each end of the multiple-turn windings is connected to a joint part used as an input and output terminal of the power module, so that the winding and the conductive body of the power module can be preformed to simplify the manufacturing process and reduce the production cost.

In accordance with an aspect of the present invention, a power module is provided. The power module includes a power device and a magnetic component. The magnetic component and the power device are stacked together, and a vertical projection of the magnetic component is at least partially overlapping with the power device. The magnetic component includes a magnetic core and at least one winding set. The magnetic core includes a first surface, a second surface and at least one window. The first surface is opposite to the second surface, the at least one window is located between the first surface and the second surface, and the window passes through the magnetic core and a passing-through axis of the window is vertical to a surface of the power device, where at least one leading pin or pad is disposed on the surface of the power device. The at least one winding set includes at least one winding portion. The at least one winding portion passes through the at least one window and electrically connected to the power device. Each winding set and the magnetic core are configured to form an inductor, and the winding set is preformed.

In accordance with another aspect of the present invention, a magnetic component of a power module is provided. The magnetic component includes a magnetic core and at least one winding set. The magnetic core includes a first surface, a second surface and at least one window. The first surface is opposite to the second surface, and the at least one window is located between the first surface and the second surface and passes through the magnetic core. The at least one winding set includes plural winding portions and at least one first joint part. Each of the plural winding portions includes a first end and a second end, and the first joint part is connected with all of or a part of the first ends of the plural winding portions and extends along the second surface of the magnetic core. Consequently, the at least one first joint part serves as a first leading pin or pad of an inductor of the power module. At least one of the plural winding portions passes through the at least one window to make the second end of the at least one of the plural winding portions serve as a second leading pin or pad of the inductor of the power module. The first joint part of the winding set and the plural winding portions are formed in one piece.

The above contents of the present invention will become more readily apparent to those ordinarily skilled in the art after reviewing the following detailed description and accompanying drawings, in which:

BRIEF DESCRIPTION OF THE DRAWINGS

FIGS. 12A to 12C are schematic views illustrating another exemplary magnetic component for the power module of FIG. 12;

FIG. 12D is a cross-sectional view illustrating the magnetic component and taken along CC line in FIG. 12C;

FIG. 12E is a top view illustrating the magnetic core of the magnetic component of FIG. 12D;

FIG. 26A is a schematic view illustrating a power module according to a thirteenth preferred embodiment of the present invention;

FIG. 26B is a partial 3D view of the power module of FIG. 26A;

FIG. 26C is a 3D view illustrating the power module of FIG. 26A;

FIG. 34A is a schematic view illustrating a power module according to a twenty-first preferred embodiment of the present invention;

FIG. 34B is a bottom view illustrating the power module of FIG. 34A;

FIG. 35A is a 3D view illustrating a power module according to another modification of the twenty-first preferred embodiment of the present invention;

FIG. 35B is a bottom view illustrating the power module of FIG. 35A;

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 2:
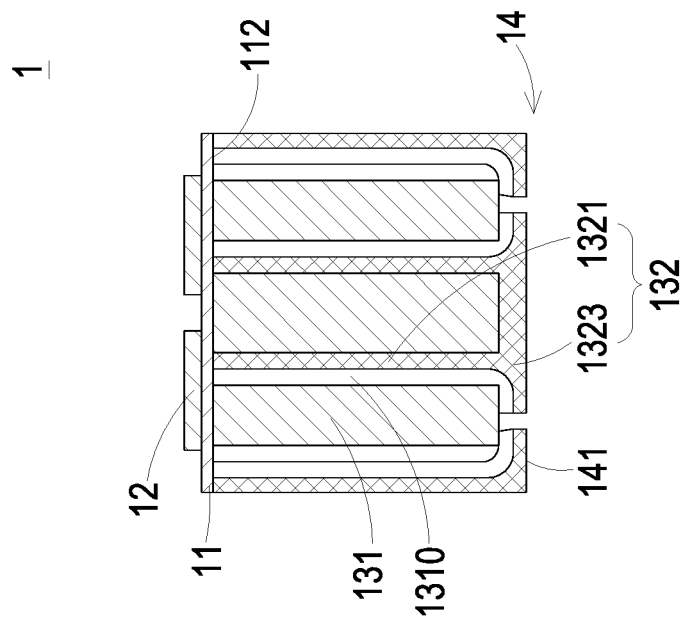
FIG. 2 is a cross sectional view illustrating the assembled power module and taken along AA line of FIG. 1.
Figure 1:
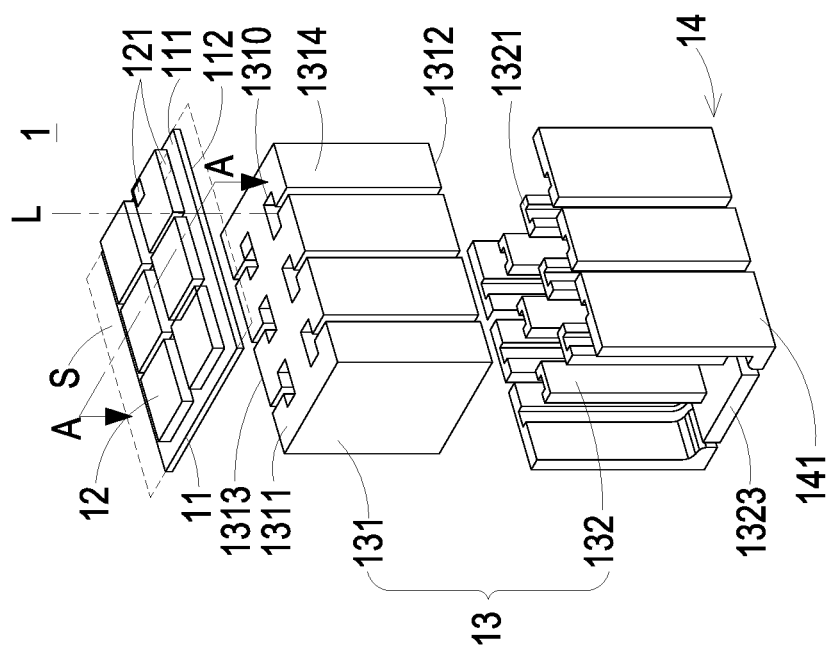
FIG. 1 is a 3D view illustrating a power module according to a first preferred embodiment of the present invention.

FIG. 1 is a 3D view illustrating a power module according to a first preferred embodiment of the present invention. FIG. 2 is a cross sectional view illustrating the assembled power module and taken along AA line of FIG. 1. As shown in FIG. 1, the power module 1 includes at least one first substrate 11, a power device 12 and a magnetic component 13. The first substrate 11, the power device 12 and the magnetic component 13 are stacked together, and a vertical projection of the magnetic component 13 is at least partially overlapping with the power device 12. In the embodiment, the magnetic component 13 includes a magnetic core 131 and at least one winding set 132. Each winding set 132 and each magnetic core 131 are configured to form an inductor. The magnetic core 131 includes a first surface 1311, a second surface 1312 and at least one window 1310. The first surface 1311 is opposite to the second surface 1312. The at least one window 1310 passes through the magnetic core 131 and is located between the first surface 1311 and the second surface 1312. Since a vertical projection of the magnetic component 13 is at least partially overlapping with the power device 12, and the window 1310 includes a passing-through axis L vertical to a surface S of the power device 12, where the surface S is provided with at least one leading pin or pad 121. Each winding set 132 includes plural first winding portions 1321 and at least one first joint part 1323. The first winding portions 1321 pass through the at least one window 1310 and are vertical and electrically connected to the first substrate 11. The at least one first joint part 1323 is connected to the first ends of the first winding portions 1321 and extended along the second surface 1312 of the magnetic core 131. The first substrate 11 includes a third surface 111 and a fourth surface 112. The power device 12 is disposed on the third surface 111 of the first substrate 11 and electrically connected to the first substrate 11. The magnetic component 13 is stacked with the first substrate 11 and the power device 12, and a vertical projection of the magnetic component 13 is at least partially overlapping with the power device 12. In this embodiment, the power module 1 includes the power device 12 and the magnetic component 13 disposed on the third surface 111 and the fourth surface 112 of the first substrate 11, respectively. The magnetic core 131 further includes a first lateral wall 1313 and a second lateral wall 1314. The first surface 1311 of the magnetic core 131 is disposed on the fourth surface 112 of the first substrate 112. The first lateral wall 1313 and the second lateral wall 1314 are opposite to each other. In the embodiment, the at least one window 1310 comprises plural windows 1310 disposed between the first surface 1311 and the second surface 1312. The winding set 132 and the power device 12 can be flexibly connected by using the first substrate 11. In some embodiments, the first substrate 11 can be omitted, and the winding set 132 is directly connected to the power device 12. Consequently the height of the module is reduced. The passing-through axes of the windows 1310 are arranged in order and parallel to each other. In some embodiments, preferably but not exclusively, the windows 1310 of the magnetic core 131 are arranged in single row or multi-rows array.

In this embodiment, the first winding portions 1321 of the winding set 132 pass through the corresponding windows 1310 respectively. The second ends of the first winding portions 1321 of the winding set 132 are electrically connected to the power device 12 through the traces or vias (not shown) of the first substrate 11. The power module 1 further includes a conductive component 14 having plural conductive portions 141, and each conductive portion 141 includes a first end connected to the power device 12 by the first substrate 11. Each conductive portion 141 extends along the first lateral wall 1313 and the second lateral wall 1314 of the magnetic core 13, and portion of the conductive portion 141 is opposite to the first joint part 1323 and extended along the second surface 1312 of the magnetic core 131. In some embodiments, the first joint part 1323 and portions of the conductive portions 141 are electrically connected to an external circuit (not shown). It is noted that, in this embodiment, the first winding portions 1321 of the winding set 132 are corresponding to the output terminals (not shown) of the power device 12 by the first substrate 11. Namely, each second end of the first winding portions 1321 of the winding set 132 is electrically connected to the power device 12 by a via (not shown) of the first substrate 11 in the shortest distance. In some embodiments, the magnetic component 13 includes at least two winding sets 132, and the at least two winding sets 132 and the magnetic core 131 form at least two inductors. The at least two inductors include a joint part in its magnetic circuit. In this embodiment, the first ends of the first winding portions 1321 of the winding set 132 are connected with the first joint part 1323, so as to reduce the output current ripple by means of interleaving and improve the stability of the output current. In some embodiments, the first joint part 1323 is further configured as the output pad of the power module 1, so as to decrease the length of outputting power circuit in the power module and reduce the power loss. On the other hand, the conductive portions 141 disposed on the outer of the first lateral wall 1313 or the second lateral wall 1314 of the magnetic core 131 can be electrically connected to the power device 12 by traces or vias (not shown) of the first substrate 11, so that other power conductive terminals, such as input terminals and ground terminals, are lead out directly and configured as the output pin of the power module 1. Consequently, the length of current transmission path is reduced, the losses are reduced, and the structure is simplified at the same time. In other embodiment, a signal transmission path can be integrated with the conductive portions 141.

Figure 5B:
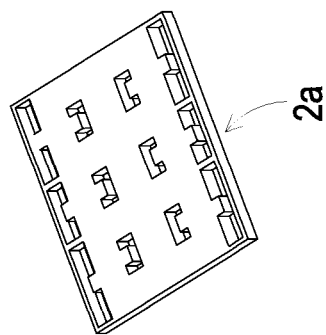
FIGS. 3, 4, 5A and 5B are schematic views illustrating the conductive component and the winding set of FIG. 1 preformed in different ways.
Figure 5A:
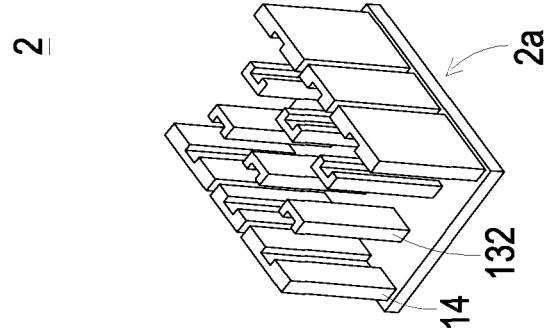
Figure 4:
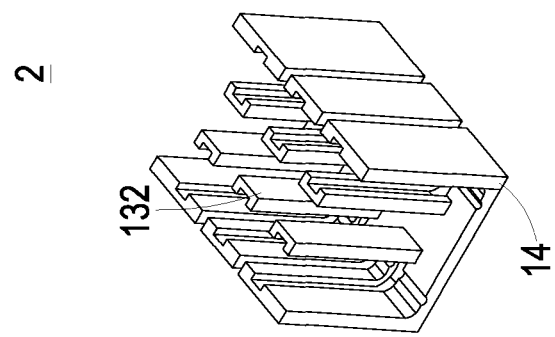
Figure 3:
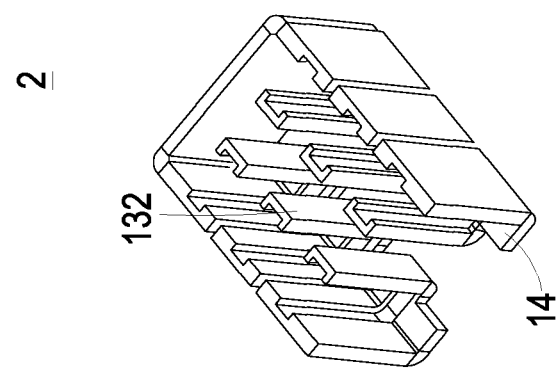

As described above, the power module 1 with high power density can be assembled easily by stacking the components together. The conductive component 14 and the first winding portions 1321 and the first joint part 1323 of the winding set 132 can be preformed. FIGS. 3, 4, 5A and 5B are schematic views illustrating the conductive component and the winding set of FIG. 1 preformed in different ways. FIGS. 3 and 4 show the preforming assembly with an integrated one-piece conductive body. FIG. 5 shows the preforming assembly with a conductive component and an insulation base. As shown in FIG. 3, the conductive component 14 and the winding set 132 of the power module 1 can be formed as a preformed conductive body 2 by means of stamping. As shown in FIG. 4, the conductive component 14 and the winding set 132 of the power module 1 can be formed as a preformed conductive body 2 by means of forging, soldering, welding or metal powder injection (MIM). As shown in FIGS. 5A and 5B, an insulation base 2a (see FIG. 5B) is utilized as a base and integrated together with the conductive component 14 and the winding set 132 of the power module 1 by means of mechanical connection to form the preformed conductive body 2. Certainly, the conductive component 14 can be constructed by means of electroplating on a shaped insulator in the preforming process. It is noted that the producing methods of conductive component 14 and the winding set 132 aren't limited to the foregoing embodiments, and can be varied according to the practical requirements.

Figure 6C:
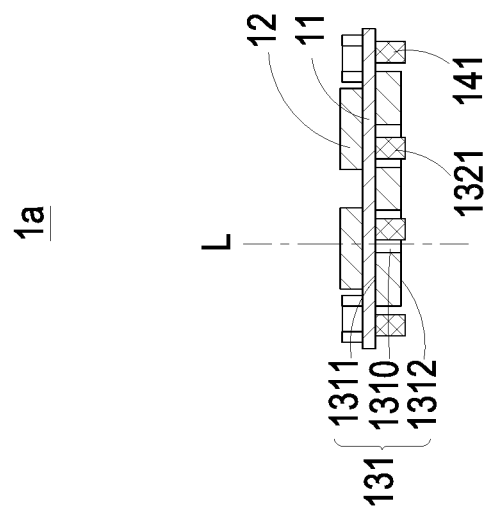
FIG. 6C is a cross-sectional view illustrating the power module and taken along BB line in FIG. 6B.
Figure 6B:
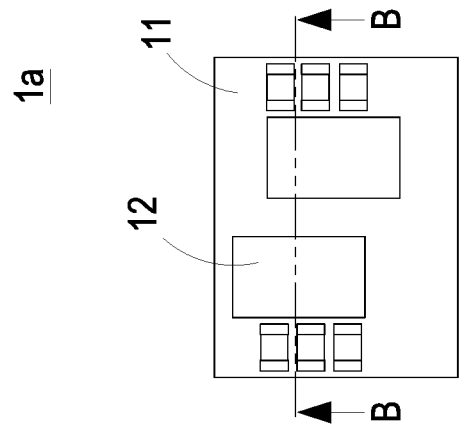
FIG. 6B is a top view of the power module of FIG. 6A.
Figure 6A:
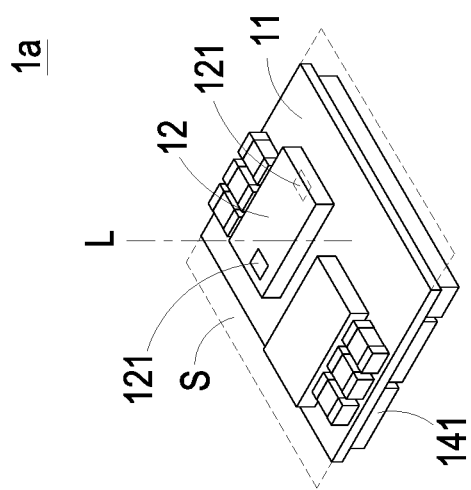
FIG. 6A is a view illustrating a power module according to a second preferred embodiment of the present invention.

FIG. 6A is a view illustrating a power module according to a second preferred embodiment of the present invention, FIG. 6B is a top view of the power module of FIG. 6A, and FIG. 6C is a cross-sectional view illustrating the power module and taken along BB line in FIG. 6B. In the embodiment, the structures, elements and functions of the power module 1a are similar to those of the power module 1 in FIGS. 1 and 2, and are not redundantly described herein. The first substrate 11, the power device 12 and the magnetic core 131 of the magnetic component 13 are stacked together, and a vertical projection of the magnetic core 131 of the magnetic component 13 is at least partially overlapping with the power device 12. The magnetic core 131 includes a first surface 1311, a second surface 1312 and at least one window 1310. The first surface 1311 and the second surface 1312 are opposite to each other. The at least one window 1310 passes through the magnetic core 131 and is located between the first surface 1311 and the second surface 1312. The window 1310 includes a passing-through axis L vertical to a surface S of the power device 12, where the surface S is provided with at least one leading pin or pad 121. In the embodiment, the conductive portion is formed by connecting a block-shape conductive body 141 to the first substrate 11, and the first winding portions 1321 are formed by connecting the block-shape conductive body to the first substrate 11 through the window 1310 of the magnetic core 131. The conductive portion 141 and the first winding portion 1321 have second ends configured as pads to lead out. This embodiment has the advantages of simple process, compact structure and shorter length of current transmission path.

Figure 7:
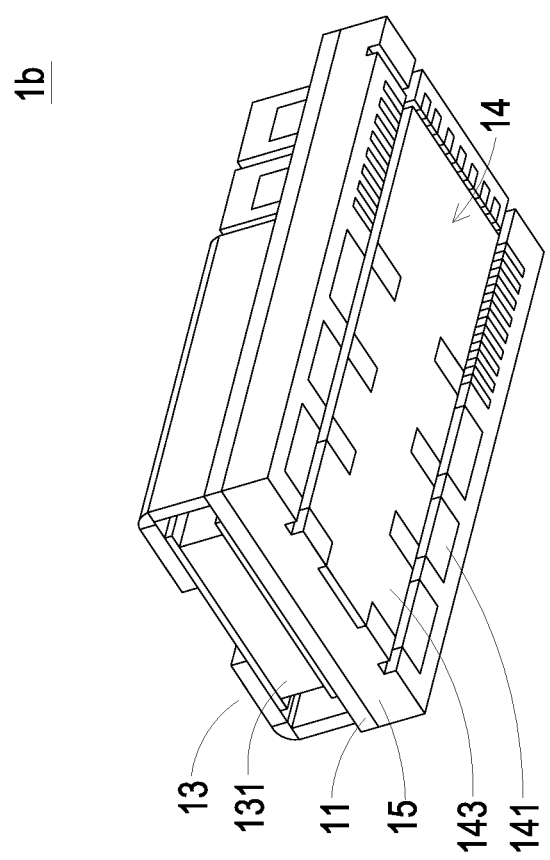
FIG. 7 is a schematic view illustrating a power module according to a third preferred embodiment of the present invention.
Figures 8, 9:
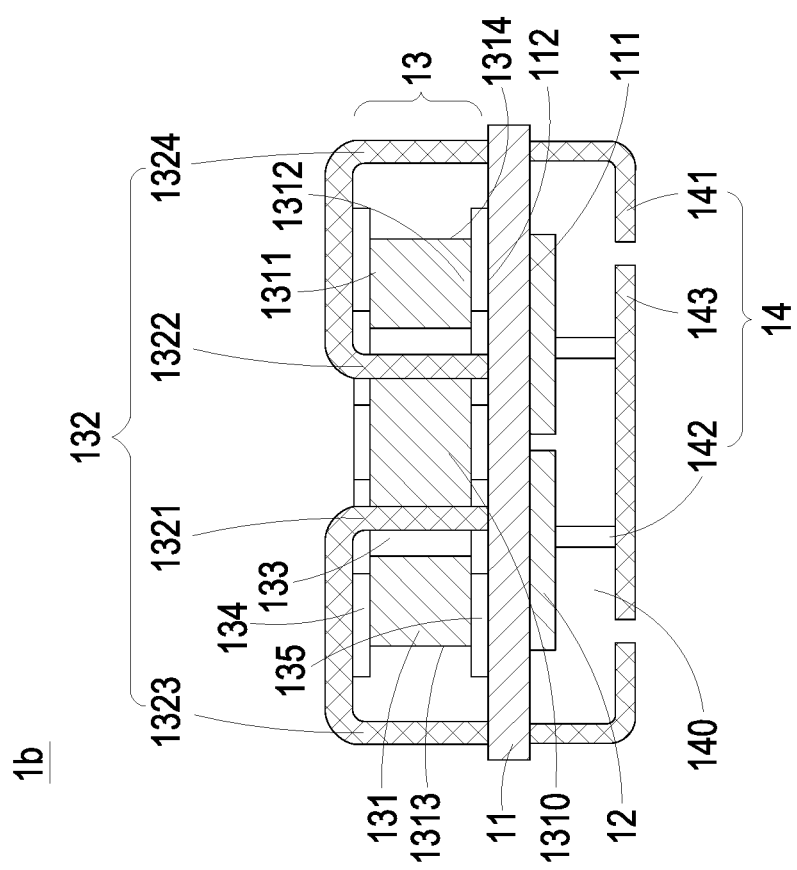
FIG. 8 is a cross sectional view illustrating the assembled power module of FIG. 7.
FIG. 9 is a schematic view illustrating a preformed conductive body for the conductive component of FIG. 7.

FIG. 7 is a schematic view illustrating a power module according to a third preferred embodiment of the present invention, and FIG. 8 is a cross sectional view illustrating the assembled power module of FIG. 7. In the embodiment, the structures, elements and functions of the power module 1b are similar to those of the power module 1 in FIGS. 1 and 2, and are not redundantly described herein. Different from the power module 1 of FIGS. 1 and 2, the power module 1b includes plural winding portions, designated as plural first winding portions 1321 and plural second winding portions 1322, and the winding set 132 further includes a first joint part 1323 and a third joint part 1324. The first joint part 1323 is connected between the first winding portions 1321 and the first substrate 11. The third joint part 1324 is connected between the second winding portions 1322 and the first substrate 11. The first joint part 1323 and the third joint part 1324 are extended along the first lateral wall 1313 and the second lateral wall 1314 of the magnetic core 131 respectively. In some embodiment, the first joint part 1323 and the third joint part 1324 are not extended over the first surface 1311 and the second surface 1312. The first joint part 1323 and the third joint part 1324 are extended along the first lateral wall 1313 and the second lateral wall 1314, respectively. Consequently, this arrangement facilitates to avoid the air gap on the first surface 1311 and the second surface 1312. Namely, the air gap of the magnetic core 131 does not overlap with the projection of the winding set 132 on the plane parallel to the first surface 1311 and it facilitates to reduce the height of the module. In some embodiment, the joint parts of the winding set 132 are retained to extend on one of the first surface 1311 and the second surface 1312. A first division plate 134 and a second division plate 135 are disposed on the first surface 1311 and the second surface 1312 of the magnetic core 131, respectively, so as to control the distance from the winding set 132 and the first substrate 11 to the first surface 1311 and the second surface 1312 of the magnetic core 131 and facilitate to control the distance from the conductive component to the air gap of the magnetic core 131. Furthermore, if the first division plate 134 and the second division plate 135 are conductor, the electrical conductivity can be enhanced by electrically connecting with the first substrate 11, or the ripple of the output current can be reduced by accomplishing the connection of the plural first winding portions 1321 and the plural second winding portions 1322 therethrough. In the embodiment, the power module 1b further includes a conductive component 14. The conductive component 14 includes plural conductive portions 141, plural leading traces 142 and a second joint part 143. The first ends of the conductive portions 141 are connected to the first substrate 11, and the power device 12 is disposed between two of leading traces 142. Each conductive portion 141 is extended along a surface, where the second joint part 143 is located at. On the other hand, the power device 12 includes at least one top pad (not shown) disposed on the top surface of the power device 12. In this embodiment, the power device 12 is electrically connected to the first substrate 11 by the top pad, as shown in FIG. 8. The first ends of the leading traces 142 are connected to the first substrate 11, and the second ends of the leading traces 142 are connected to the second joint part 143. FIG. 9 is a schematic view illustrating a preformed conductive body for the conductive component of FIG. 7. In the embodiment, the conductive portions 141, the leading traces 142 and the second joint part 143 of the conductive component 14 can be formed by cutting the preformed conductive body 2 of FIG. 9, but it is not limited thereto. In the embodiment, the power device 12 and the magnetic component 13 of the power module 1b are disposed on the third surface 111 and the fourth surface 112 of the first substrate 11 respectively. In other embodiment, the conductive portions 141 and the second joint part 143 of the conductive component 14 form an accommodation trough 140 on the first substrate 11. The power device 12 is accommodated in the accommodation trough 140. In an embodiment, an encapsulation layer 15 is filled into the accommodation trough 140, so as to provide the mechanical support and protect the power device 12 and other electronic components. The conductive portions 141 and the second joint part 143 of the conductive component 14 are configured to electrically connect with an external circuit (not shown). In the embodiment, the power device 12 and the magnetic component 13 of the power module 1b are stacked on the vertical projection of the first substrate 11 so as to simplify the structure, reduce the current consumption, reduce the length of pin of the power module effectively, and improve the power density of the power module. In the foregoing embodiment, since the vertical projection of the magnetic assembly 13 is at least partially overlapped with the power device 12, the tracing distance can be reduced.

Moreover, the preformed conductive body 2 utilized to produce the conductive component 14 or the winding set 132 has a symmetrical structure, so that the multi-phase current consistency of the power module 1 and the power module 1b is greatly improved. The output power capability and efficiency of the power module are improved by using the current balance output. The symmetrical structure also helps to reduce assembly stress and thermal stress of the power module, and enhance the reliability of the power module.

Figure 11:
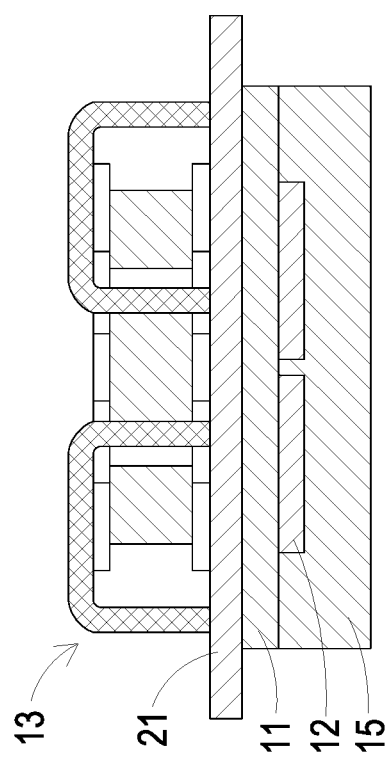
FIG. 11 is a cross sectional view illustrating a power module according to fourth preferred embodiment of the present invention.
Figure 10:
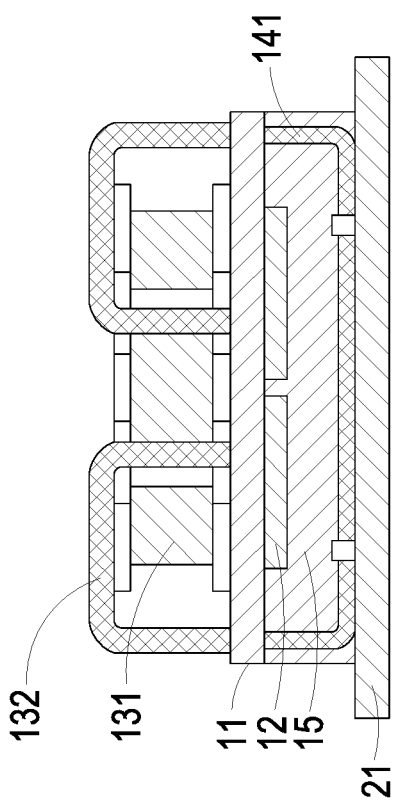
FIG. 10 is a cross sectional view illustrating a variety example of the assembled power module of FIG. 7.

FIG. 10 is a cross sectional view illustrating a variety example of the assembled power module of FIG. 7. In the embodiment, the power module 1b further includes an encapsulation layer 15 and a second substrate 21. The encapsulation layer 15 is disposed between the first substrate 11 and the second substrate 21, and the power device 12 is encapsulated in the encapsulation layer 15. The conductive portions 141 are disposed between the first substrate 11 and the second substrate 21. The first ends of the conductive portions 141 are electrically connected to the first substrate 11, and the power device 12 is disposed between two of the conductive portions 141. The second ends of the conductive portions 141 are electrically connected to the second substrate 21. Namely, the power module 1b of FIGS. 7 and 8 can be constructed with a second substrate 21 to obtain the power module 1b of FIG. 10. Thus, the second substrate 21 can be regarded as an application of client substrate. Alternatively, the second substrate 21 is disposed between the first substrate 11 and the magnetic component 13. FIG. 11 is a cross sectional view illustrating a power module according to fourth preferred embodiment of the present invention. In the embodiment, the structures, elements and functions of the power module 1c are similar to those of the power module 1b in FIG. 10, and are not redundantly described herein. In the embodiment, the power module 1c includes a second substrate 21 disposed between the first substrate 11 and the magnetic component 13. In practice, firstly the power device 12 is disposed on the first substrate 11 and covered by an encapsulation layer 15. Then, the power device 12 and the magnetic component 13 are disposed on the two opposite surfaces of the second substrate 21 respectively. In an embodiment, the second substrate 21 can be a client substrate. Comparing with the power module 1b of FIG. 10, the power density of the power module 1c is improved. It is noted that, in some embodiments, the encapsulation layer 15 of the power module 1c can be omitted. However, if the encapsulation layer 15 is retained, the power device 12 and other devices on the first substrate 11 can be protected. It is also beneficial to the heat dissipation of the power device 12 and the aesthetic appearance of the power module. Certainly, the present invention is not limited thereto and not redundantly described herein.

Figure 12:
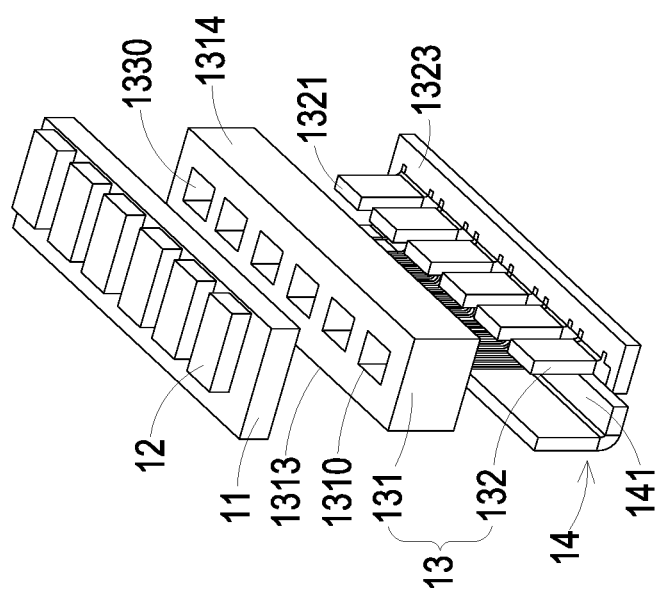
FIG. 12 is a 3D view illustrating a power module according to a fifth preferred embodiment of the present invention.

FIG. 12 is a 3D view illustrating a power module according to a fifth preferred embodiment of the present invention. In the embodiment, the structures, elements and functions of the power module 1d are similar to those of the power module 1 in FIGS. 1 and 2, and are not redundantly described herein. Different from the power module 1 of FIGS. 1 and 2, the magnetic component 13 of the power module 1d includes plural windows 1310 disposed in a linear arrangement and a winding set 132 having plural first winding portions 1321 disposed in a linear arrangement. The first winding portions 1321 pass through the corresponding windows 1310, and the second ends of the first winding portions 1321 are electrically connected to the first substrate 11. The winding set 132 further includes a first joint part 1323 connected with the first ends of the first winding portions 1321. On the other hand, the power module 1d further includes a conductive portion 141 having a first end connected with the first substrate 11. The conductive portion 141 is extended along the first lateral wall 1313 or the second lateral wall 1314 of the magnetic core 131, and a second end of the conductive portion 141 is extended along the surface, where the first joint part 1323 is located at.

It is noted that the magnetic component 13 used in the power module 1d is adjustable and can be constructed as different inductors according to the practical requirements. FIGS. 12A, 12B, 12C and 12D show another exemplary magnetic component for the power module 1d (FIG. 12). FIG. 12E is a top view illustrating the magnetic core of the magnetic component. As shown in FIGS. 12A to 12E, an inductor 3 served as the magnetic component and incudes a magnetic core 131 and at least one winding set 132a. The magnetic core 131 includes a first surface 1311, a second surface 1312 and at least one window 1310. The first surface 1311 and the second surface 1312 are opposite to each other. The at least one window 1310 is located between the first surface 1311 and the second surface 1312. The magnetic core 131 further includes a first lateral wall 1313 and a second lateral wall 1314, and the first lateral wall 1313 and the second lateral wall 1314 are opposite to each other. Plural air gaps 1315 are formed on a magnetic column which comprises at least part of the second lateral walls 1314 of the magnetic core 131 and each of air gaps is in communication with the corresponding window 1310. The winding set 132a includes plural winding portions 1325 and at least one first joint part 1323. At least one of the plural winding portions 1325 passes through the at least one window 1310. The first joint part 1323 is connected to the first ends of the plural winding portions 1325 and extended along the second surface 1312 of the magnetic core 131. Consequently, the first joint part 1323 is served as a first leading pin or pad of the inductor. The plural winding portions 1325 of the winding set 132a pass through the plural corresponding windows 1310 of the magnetic core 131 and the second ends of the plural winding portions 1325 are served as plural leading pins of the inductor. In the embodiment, the plural winding portions 1325 and the first joint part 1323 are connected by means of soldering or assembling to form an integrated structure. Preferably, the plural winding portions 1325 and the first joint part 1323 are formed in one piece which is not formed by soldering or assembling. Furthermore, for facilitating to connect and position each second end of the plural winding portions 1325 with the foregoing power module 1d flexibly, the second ends of the plural winding portions 1325 are further bent after passing through the corresponding windows 1310 of the magnetic core 131. Consequently, the second ends of the plural winding portions 1325 on the first surface 1311 of the magnetic core 131 are extended along the second lateral wall 1314, where the air gaps 1315 are located at, as shown in FIG. 12C. In another embodiment, the second ends of the plural winding portions 1325 can be extended on the first surface 1411 along the other direction. Please refer to FIG. 12D. FIG. 12D is a cross-sectional view illustrating the magnetic component and taken along CC line in FIG. 12C. In order to reduce the eddy current loss caused by the leakage flux of the magnetic core 131 on the winding set 132a, the winding set 132a of the magnetic component 3 can be retained in a certain avoidance distance away from the air gap 1315 of the magnetic core 131. In the embodiment, the first joint port 1323 of the winding set 132a, the main parts of the winding portions 1325 and the second ends of the winding portions 1325 are retained in the certain avoidance distances $D_1$, $D_2$ and D$_3$ away from the air gaps 1315 of the magnetic core 131 instead of contacting with the air gaps 1325 directly. In practical, the winding set 132*a* can be fixed on the magnetic column which the first lateral wall of the magnetic core 131 on by an adhesive directly, but it is not limited thereto. Alternatively, an insulated material is disposed between the winding set 132*a* and the air gaps 1315 so as to control the avoidance distances D$_1$, D$_2$ and D$_3$. Preferably, at least one or all of the avoidance distance D and the winding width W meet the equation of W/8<D<W/2, wherein the window width W represents the larger distance of the window cross section, as shown in FIG. 12E. In another embodiment, the inductor 3 can further include plural winding sets. For example, in the embodiment, the inductor 3 further includes a second winding set 132*b*.

Figure 14:
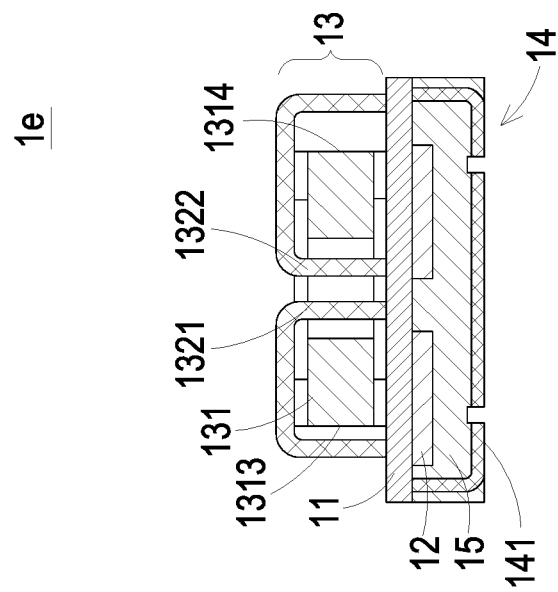
FIG. 14 is a cross-sectional view illustrating the power module of FIG. 13.
Figure 13:
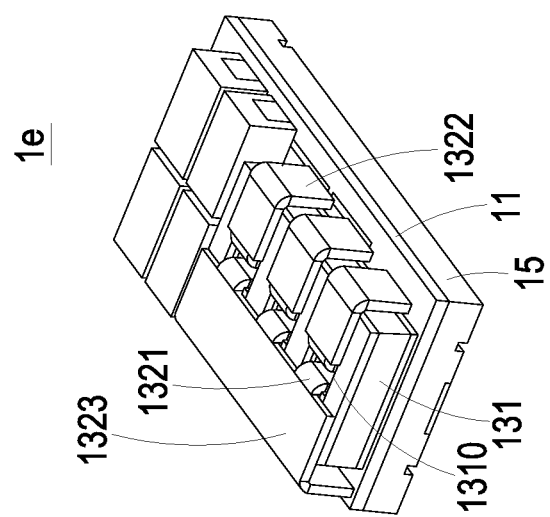
FIG. 13 is a schematic view illustrating a power module according to a sixth preferred embodiment of the present invention.

FIG. 13 is a schematic view illustrating a power module according to a sixth preferred embodiment of the present invention, and FIG. 14 is a cross-sectional view illustrating the power module of FIG. 13. In the embodiment, the structures, elements and functions of the power module 1*e* are similar to those of the power module 1 in FIGS. 1 and 2, and are not redundantly described herein. In the embodiment, the power module 1*e* includes plural winding portions, designated as plural first winding portions 1321 and plural second winding portions 1322. Each window 1310 is accommodated with at least one first winding portion 1321 and at least one second winding portion 1322, and each first end of the at least one first winding portion 1321 and the at least one second winding portion 1322 is electrically connected to the power device 12 through the first substrate 11. In addition, the winding set 132 further includes a first joint part 1323. Portion of the first joint part 1323 is extended along the first lateral wall 1313 and connected between the at least one first winding portion 1321 and the first substrate 11. On the other hand, the at least one second winding portion 1322 is extended along the second lateral wall 1314 of the magnetic core 131, and the second end of the at least one second winding portion 1322 is connected with the first substrate 11. In the embodiment, the power module 1*e* further includes plural conductive portions 141 and an encapsulation layer 15. The conductive portions 141 are electrically connected to the first substrate 11. The encapsulation layer 15 disposed on the first substrate 11 encapsulates the power device 12 and the conductive portions 141, and partially exposes the conductive portions 141. In the embodiment, at least one first winding portion 1321 and at least one second winding portion 1322 pass through a corresponding window 1310 together, but it is not limited thereto. The number of winding portions passing through the window is adjustable according to the practical requirements. On the other hand, in the embodiment, the circuit connection between the first winding portion 1321 and the second winding portion 1322 is adjustable to provide various electrical characteristics. When the first winding portion 1321 and the second winding portion 1322 are connected in series, the window 1310 of the magnetic component 13 has multiple turns of winding. When the first winding portion 1321 and the second winding portion 1322 are connected in parallel and have currents flowing through the window 1310 in opposite directions, the window 1310, the first winding portion 1321 and the second winding portion 1322 of the magnetic component 13 constitutes a negative coupling inductance. Moreover, when the first winding portion 1321 and the second winding portion 1322 are connected in parallel and the currents flowing through the window 1310 in the same direction, the phase of the magnetic component 13 can be regarded as the same as that of the single window receiving single winding portion, and only the winding set is divided into two paths. The window 1310, the first winding portion 1321 and the second winding portion 1322 of the magnetic component 13 constitutes a positive coupling inductance. Thus, the two winding portions belong to different winding paths, and the connection of the magnetic component 13 and the first substrate 11 can be more flexible. The aforementioned preformed conductive body 2 for constituting the winding set 132 can be made thinner.

Figure 16:
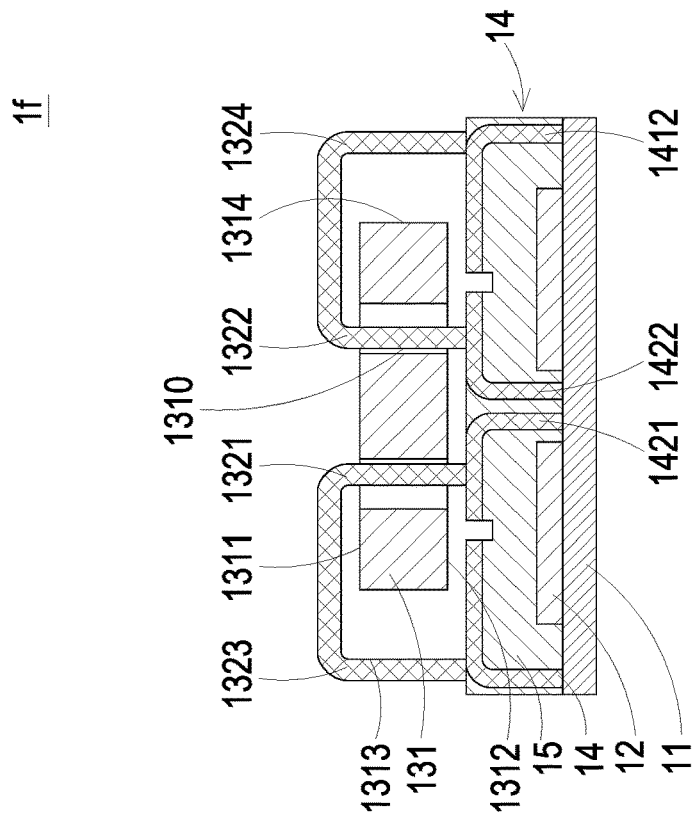
FIG. 16 is a cross sectional view illustrating the assembled power module of FIG. 15.
Figure 15:
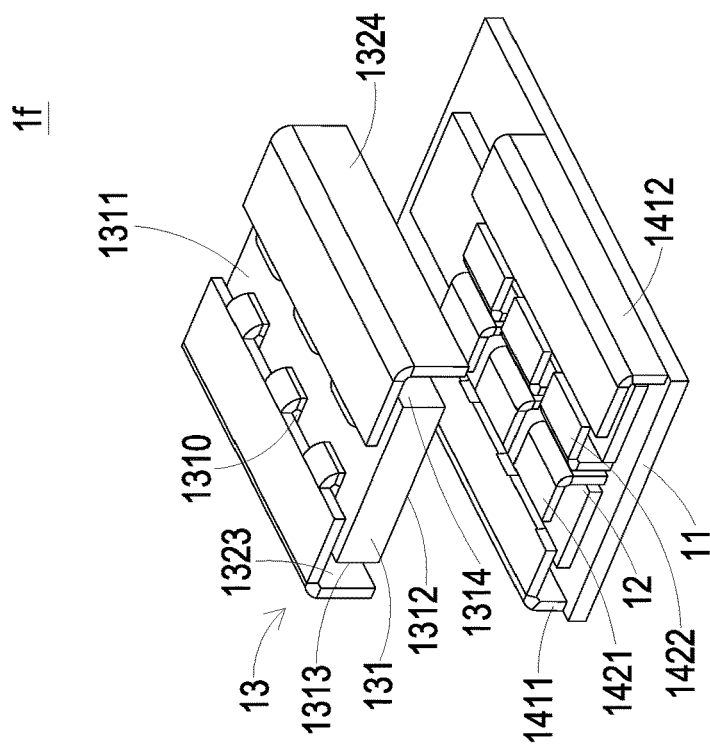
FIG. 15 is a 3D view illustrating a power module according to a seventh preferred embodiment of the present invention.

FIG. 15 is a 3D view illustrating a power module according to a seventh preferred embodiment of the present invention, and FIG. 16 is a cross sectional view illustrating the assembled power module of FIG. 15. In the embodiment, the structures, elements and functions of the power module 1*f* are similar to those of the power module 1*b* in FIGS. 7 and 8, and are not redundantly described herein. Different from the power module 1*b* of FIGS. 7 and 8, the power device 12 and the magnetic component 13 of the power module 1*f* are disposed on the same surface of the first substrate 11, and the power device 12 is disposed between the magnetic component 13 and the first substrate 11. In the embodiment, the magnetic core 131 of the magnetic component 13 includes a first surface 1311, a second surface 1312, a first lateral wall 1313 and a second lateral wall 1314. The first surface 1311 is opposite to the second surface 1312, the second surface 1312 is disposed nearby the power device 12, and the first lateral wall 1313 and the second lateral wall 1314 are opposite to each other. In the embodiment, the magnetic core 131 includes plural windows 1310. The windows 1310 are disposed between the first surface 1311 and the second surface 1312, whose passing-through axes are parallel to each other. The first winding portions 1321 and the second winding portions 1322 of the winding set 132 pass through the corresponding windows 1310 of the magnetic core 131 respectively. The winding set 132 further includes a first joint part 1323 and a third joint part 1324. The first joint part 1323 is connected with the first ends of the first winding portions 1321. The third joint part 1324 is connected with the first ends of the second winding portions 1322. The first joint part 1323 and the third joint part 1324 are extended along the first lateral wall 1313 and the second lateral wall 1314 of the magnetic core 131 respectively. In the embodiment, the power module 1*f* further includes a conductive component 14. The conductive component 14 includes a first conductive portion 1411, a second conductive portion 1412, plural first leading traces 1421 and plural second leading traces 1422. The first ends of the first leading traces 1421 and the second leading traces 1422 are electrically connected with the first substrate 11 respectively. The second ends of the first leading traces 1421 are electrically connected to the second ends of the first winding portions 1321, and the second ends of the second leading traces 1422 are electrically connected to the second ends of the second winding portions 1322. On the other hand, the first ends of the first conductive portion 1411 and the second conductive portion 1412 are electrically connected to the first substrate 11 respectively. The first joint part 1323 is connected to the second ends of the first conductive portions 1411, and the third joint part 1324 is connected to the second ends of the second conductive portions 1412.

In some embodiments, the conductive component 14 can be preformed. The power module 1*f* further include an encapsulation layer 15 disposed on the first substrate 11. The encapsulation layer 15 encapsulates the power device 12 and the conductive component 14 and partially exposes the first conductive portion 1411, the second conductive portion 1412, the first leading traces 1421 and the second leading traces 1422, so as to provide a mechanical support and protect the power devices 12 or other electronic components. Similarly, the first conductive portion 1411, the second conductive portion 1412, the first leading traces 1421 and the second leading traces 1422 of the conductive component 14 can be formed by means of cutting a preformed conductive body 2 (see FIG. 9), and it is not limited thereto. In the embodiment, the power device 12 and the magnetic component 13 are disposed on the same side of the first substrate 11. The first substrate 11 includes at least one pad (not shown) disposed on another surface. Thus, the pad can be electrically connected to the power device 12 and the conductive component 14 through a trace or via on the first substrate 11, or configured as an output-leading pad of the power module 1*f*, and it is not limited thereto.

Figure 17:
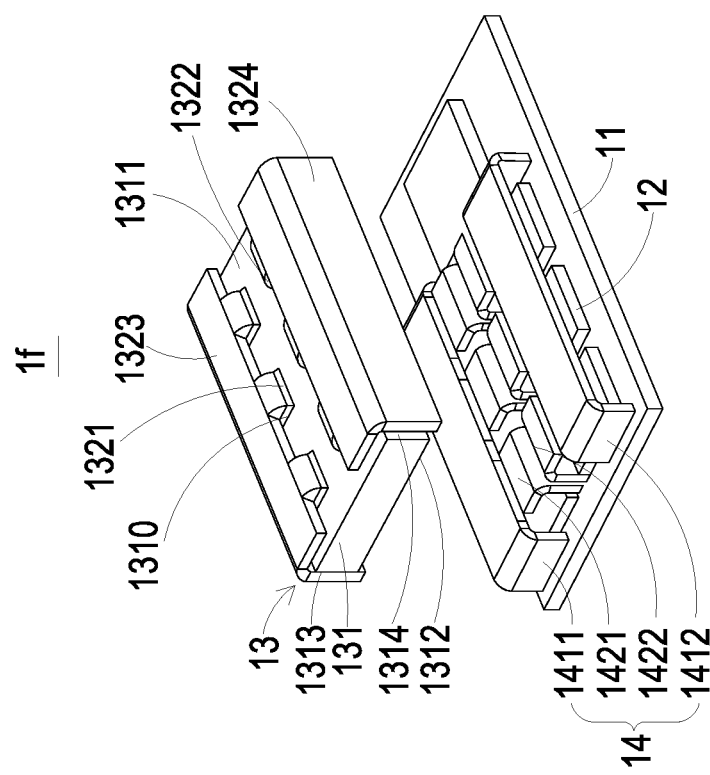
FIG. 17 is a 3D view illustrating a variety example of the assembled power module of FIG. 15.

FIG. 17 is a 3D view illustrating a variety example of the assembled power module of FIG. 15. The conductive component 14 of the power module if includes a first conductive portion 1411, a second conductive portion 1412, plural first leading traces 1421 and plural second leading traces 1422. The first ends of the first leading traces 1421 and the second leading traces 1422 are electrically connected with the first substrate 11 respectively. The second ends of the first leading traces 1421 are electrically connected to the second ends of the first winding portions 1321, and the second ends of the second leading traces 1422 are electrically connected to the second ends of the second winding portions 1322. On the other hand, the first conductive portion 1411 and the second conductive portion 1412 are stacked on the power device 12. The first end and the second end of the first conductive portion 1411 is connected to the first substrate 11, and an upper surface of the first conductive portion 1411 is extended over the power device 12. The first end and the second end of the second conductive portion 1412 is connected to the first substrate 11, and an upper surface of the second conductive portion 1412 is extended over the power device 12. The first joint part 1323 and the third joint part 1324 of the magnetic component 13 are connected to the upper surfaces of the first conductive portion 1411 and the second conductive portion 1412 respectively. In the embodiment, the conductive component 14 is provided with mechanical support function. Thus, the magnetic component 13 and the power device 12 can be stacked on the same surface of the first substrate 11 by the connections of the first conductive portion 1411, the second conductive portion 1412, the first leading traces 1421 and the second leading traces 1422. The first substrate 11 includes at least one pad (not shown) disposed on another surface and electrically connected to the power device 12 and the conductive component 14 through a trace or via on the first substrate 11, or configured as an output-leading pad of the power module 1*f*. The present invention is not limited thereto.

Figure 18:
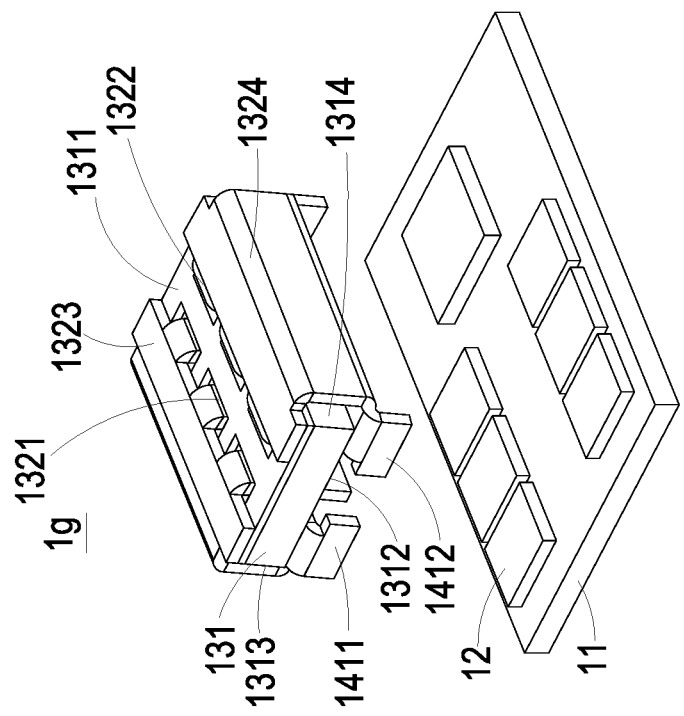
FIG. 18 is a 3D view illustrating a power module according to an eighth preferred embodiment of the present invention.

FIG. 18 is a 3D view illustrating a power module according to an eighth preferred embodiment of the present invention. Comparing to the power module if of FIG. 17, the winding set 132 of the power module 1*g* further includes plural first winding portions 1321 and plural second winding portions 1322 passing through the corresponding windows 1310 of the magnetic core 131, and the second ends of the first winding portions 1321 and the second winding portions 1322 are connected with the first substrate 11 directly. The first joint part 1323 and the first conductive portion 1411 are formed in one piece, and the third joint part 1324 and the second conductive portion 1412 are formed in one piece. The magnetic core 131 can be assembled with the foregoing pieces during forming, so as to facilitate the power module 1*g* to meet the requirement of high power density in a compact assembly.

Figure 19:
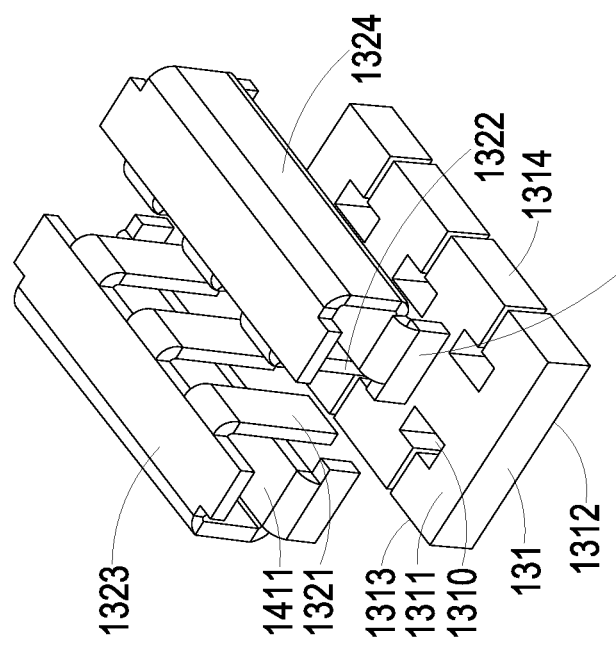
FIG. 19 is a partial 3D view of the power module of FIG. 18.

FIG. 19 is a partial 3D view of the power module of FIG. 18. As shown in FIG. 19, the magnetic core 131 of the power module 1*g* is disposed among the first conductive portion 1411 and the second conductive portion 1412 and the power device 12 (see FIG. 18). Namely, the first surface 1311 of the magnetic core 131 is adjacent to the bottom surfaces of the first conductive portion 1411 and the second conductive portion 1412, and the second surface 1312 of the magnetic core 131 is adjacent to the power device 12 disposed on the first substrate 11 (see FIG. 18). The magnetic core 131 is connected to the first substrate 11 in the final assembly.

Figure 20A:
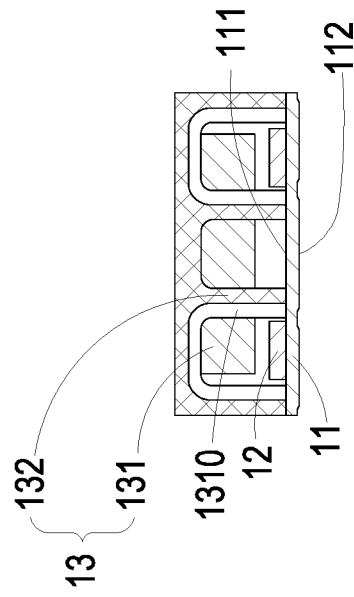
FIGS. 20A and 20B are cross-sectional views illustrating a power module according to a ninth preferred embodiment of the present invention.
Figure 21:
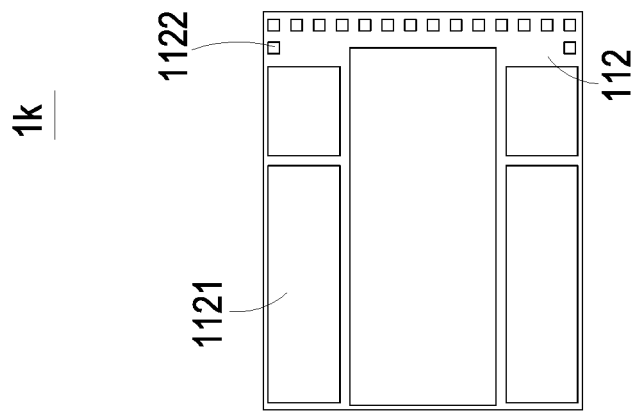
FIG. 21 is a bottom view illustrating the power module of FIGS. 20A and 20B.
Figure 20B:
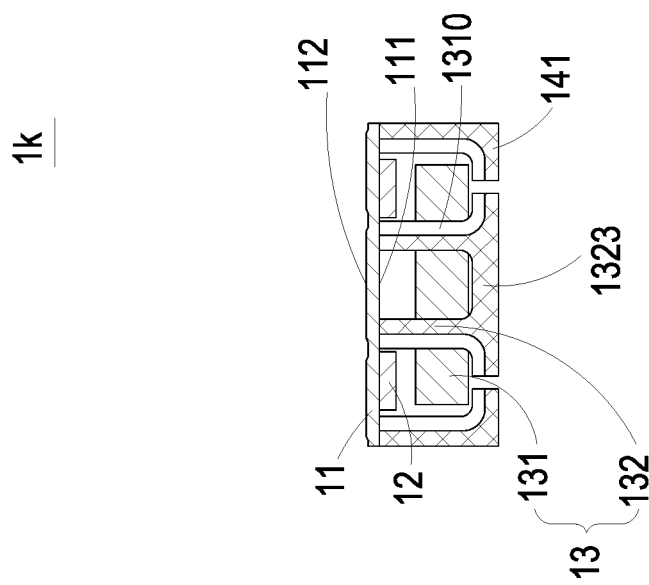

FIGS. 20A and 20B are cross-sectional views illustrating a power module according to a ninth preferred embodiment of the present invention, and FIG. 21 is a bottom view illustrating the power module of FIGS. 20A and 20B. In the embodiment, the structures, elements and functions of the power module 1*h* are similar to those of the power module 1*f* in FIGS. 15 and 16, and are not redundantly described herein. Different from the power module 1*f* of FIGS. 15 and 16, the magnetic component 13 of the power module 1*h* includes a magnetic core 131, a winding set 132 and a corresponding window 1310, so as to accomplish a modularization and be directly disposed on the third surface 111 of the first substrate 11 with the power device 12, as shown in FIG. 20A. The first substrate 11 includes plural corresponding pads disposed on the fourth surface 112 (see FIG. 21). The corresponding pads disposed on the fourth surface 112 of the first substrate 11 are configured as power pins and signal pins of the power module 1*h*. Consequently, the production of the power module 1*h* is simplified. In some embodiments, the preformed body with the winding set 132 can be cut to form the first joint part 1323 of the winding set 132 and the conductive portions 141 nearby two lateral walls of the magnetic core 131, as shown in FIG. 20B. Different from the embodiment of FIG. 20A, the power module 1*h* can be electrically connected to an external circuit (not shown) or configured as the corresponding pads of FIG. 21 by utilizing the first joint part 1323 and portion of the conductive portions 141, so as to increase the variability of the design. Certainly, the present invention is not limited thereto and not redundantly described herein.

Figure 23:
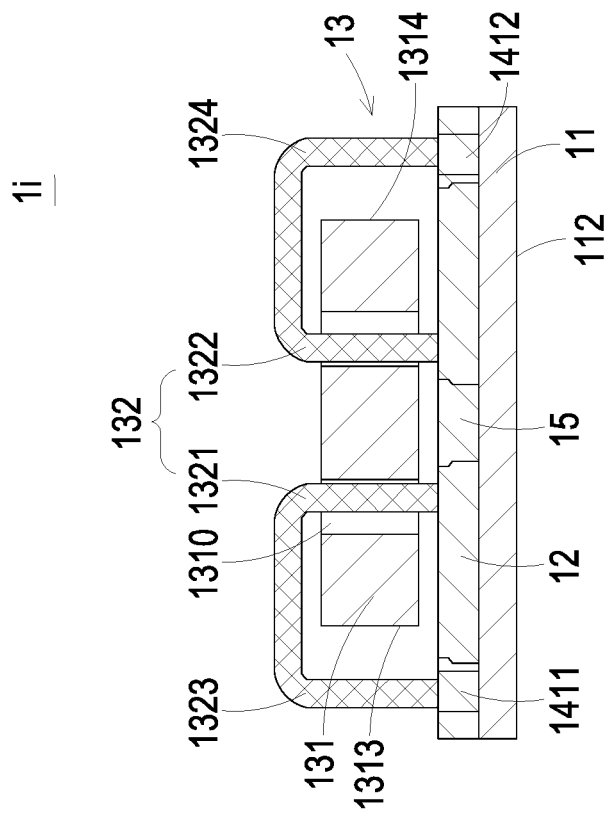
FIG. 23 is a cross sectional view illustrating the assembled power module of FIG. 22.
Figure 22:
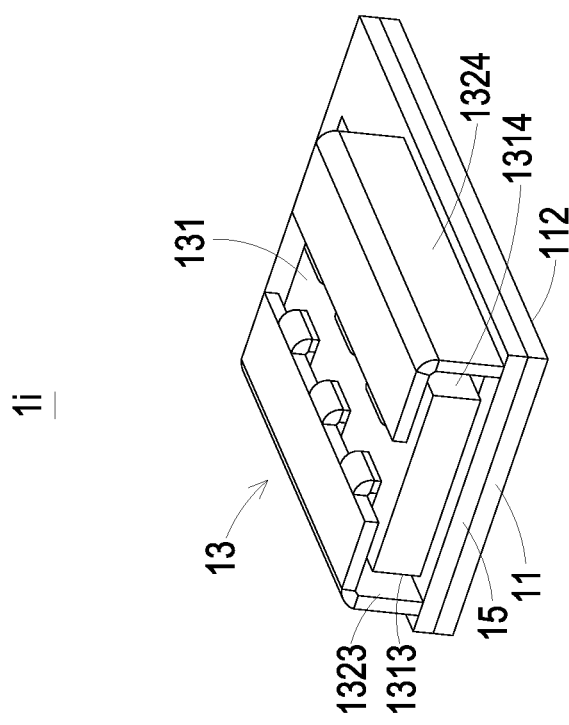
FIG. 22 is a schematic view illustrating a power module according to a tenth preferred embodiment of the present invention.

FIG. 22 is a schematic view illustrating a power module according to a tenth preferred embodiment of the present invention, and FIG. 23 is a cross sectional view illustrating the assembled power module of FIG. 22. In the embodiment, the structures, elements and functions of the power module 1*i* are similar to those of the power module 1*f* in FIGS. 15 and 16, and are not redundantly described herein. Different from the power module 1*f* of FIGS. 15 and 16, the power device 12 of the power module 1*f* further includes at least one top pad and at least one bottom pad (not shown) disposed on the top surface and the bottom surface respectively, so that the bottom surface of the power device 12 is electrically connected to the top surface of the first substrate 11 directly, and the top surface of the power device 12 is electrically connected to the winding set 132 of the magnetic component 13 directly. The winding set 132 includes plural winding portions designated as plural first winding portions 1321 and plural second winding portions 1322. The first winding portions 1321 and the second winding portions 1322 pass through the corresponding windows 1310 of the magnetic core 131. The first ends of the first winding portions 1321 and the second winding portions 1322 of the winding set 132 are electrically connected to the pads (not shown) disposed on the top surface of the power device 12. The winding set 132 further includes a first joint part 1323 and a third joint part 1324. The first joint part 1323 is connected to the first winding portions 1321. The third joint part 1324 is connected to the second winding portions 1322. The first joint part 1323 and the third joint part 1324 are extended along the first lateral wall 1313 and the second lateral wall 1314 of the magnetic core 131 respectively. In the embodiment, the power module 1i further includes a conductive component 14. The conductive component 14 includes a first conductive portion 1411 and a second conductive portion 1412. The first conductive portion 1411 is connected to the first joint part 1323, and the second conductive portion 1412 is connected to the third joint part 1324. The first joint part 1323 and the third joint part 1324 are connected to the first substrate 11 through the first conductive portion 1411 and the second conductive portion 1412 respectively. In the embodiment, the power device 12 further includes at least one top pad and at least one bottom pad (not shown) disposed on the top surface and the bottom surface respectively, so that the power device 12 is electrically connected to the first substrate 11 via the at least one bottom pad disposed on the bottom surface of the power device 12, and the power device 12 is electrically connected to the first winding portions 1321 and the second winding portions 1322 via the at least one top pad disposed on the top surface of the power device 12. On the other hand, the power module 1i further includes an encapsulation layer 15 disposed on the first substrate 11. The encapsulation layer 15 encapsulates the power device 12 and the first conductive portion 1411 and the second conductive portion 1412 of the conductive component 14 and partially exposes the power device 12, the first conductive portion 1411 and the second conductive portion 1412. In some embodiment, the first substrate 11 includes at least one pad (not shown) disposed on the bottom surface 112 of the first substrate 11 opposite to the top surface 111, where the power device 12 and the magnetic component 13 are disposed on. The at least one pad of the first substrate 11 is electrically connected to the power device 12, the first conductive portion 1411 and the second conductive portion 1412 through the leading trace or via (not shown), so as to reduce the length of current transmission path effectively, achieve the purposes of simplifying the structure, improving the efficiency, the power density and the reliability of the power module.

Figures 24A, 24B, 25:
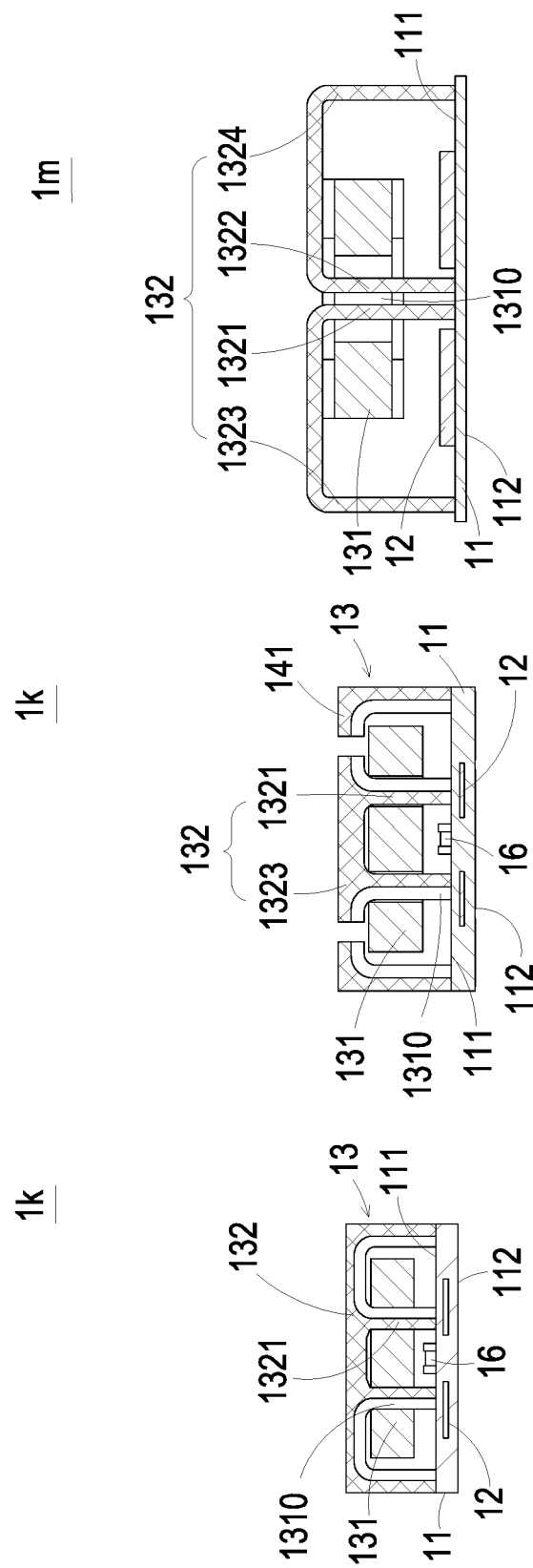
FIGS. 24A and 24B are cross-sectional views illustrating an assembled power module according to an eleventh preferred embodiment of the present invention.
FIG. 25 is a cross-sectional view illustrating an assembled power module according to a twelfth preferred embodiment of the present invention.

FIGS. 24A and 24B are cross-sectional views illustrating an assembled power module according to an eleventh preferred embodiment of the present invention. In the embodiment, the structures, elements and functions of the power module 1k are similar to those of the power module 1f in FIGS. 15 and 16, and are not redundantly described herein. Different from the power module 1f of FIGS. 15 and 16, the power device 12 of the power module 1k is an embedded power chip die, which is embedded in the first substrate 11. The magnetic component 13 is disposed on the third surface 111 of the first substrate 11, and a vertical projection of the magnetic component 13 is at least partially overlapping with the power device 12. The magnetic component 13 includes a magnetic core 131 and a winding set 132. The magnetic core 131 includes at least one window 1310, and the window 1310 is opposite to the first substrate 11 and the power device 12. The winding set 132 includes plural first winding portions 1321 passing through the corresponding windows, so that the first winding portions 1321 are vertical to the first substrate 11 and electrically connected to the first substrate 11. In the embodiment, since the power device 12 is embedded in the first substrate 11, other electronic component 16 can be disposed on the third surface 111 of the first substrate 11. Consequently, the space between the magnetic component 13 and the first substrate 11 can be utilized efficiently. In other embodiment, the first substrate 11 includes at least one pad (not shown) disposed on the bottom surface 112 of the first substrate 11, and the at least one pad of the first substrate 11 is electrically connected to the power device 12, the magnetic component 13 or the electronic component 16 through the leading trace or via (not shown), so as to reduce the length of current transmission path effectively, achieve the purposes of simplifying the structure, improving the efficiency, the power density and the reliability of the power module. Alternatively, in some embodiments, the preformed body with the winding set 132 can be cut to form the first joint part 1323 of the winding set 132 and the conductive portions 141 nearby two lateral walls of the magnetic core 131, as shown in FIG. 24B. Different from the embodiment of FIG. 24A, the power module 1k can be electrically connected to an external circuit (not shown) by utilizing the first joint part 1323 and portion of the conductive portions 141, so as to increase the variability of the design. Certainly, the present invention is not limited thereto and not redundantly described herein.

FIG. 25 is a cross-sectional view illustrating an assembled power module according to a twelfth preferred embodiment of the present invention. In the embodiment, the structures, elements and functions of the power module 1m are similar to those of the power module 1h of FIGS. 20A and 20B, and are not redundantly described herein. Different from the power module 1h of FIGS. 20A and 20B, the power module 1m includes plural winding portions, designated as plural first winding portions 1321 and plural second winding portions 1322. Each window 1310 is accommodated with a first winding portion 1321 and a second winding portion 1322. The first ends of the first winding portions 1321 and the second winding portions 1322 are electrically connected to the first substrate 11. In addition, the winding set 132 further includes a first joint part 1323 and a third joint part 1324. The first joint part 1323 is connected between the first winding portions 1321 and the first substrate 11, and the third joint part 1324 is connected between the second winding portions 1322 and the first substrate 11. The first joint part 1323 and the third joint part 1324 are extended along the first lateral wall 1313 and the second lateral wall 1314 of the magnetic core 131 respectively. The first joint part 1323 and the third joint part 1324 are also electrically connected to the first substrate 11. In the embodiment, a first winding portion 1321 and a second winding portion 1322 pass through a corresponding window 1310 together, but it is not limited thereto. The number of winding portions passing through a single window is adjustable according to the practical requirements. The circuit connection between the first winding portion 1321 and the second winding portion 1322 is adjustable to provide various electrical characteristics. When the first winding portion 1321 and the second winding portion 1322 are connected in series, the window 1310 of the magnetic component 13 has multiple turns of winding. When the first winding portion 1321 and the second winding portion 1322 are connected in parallel and have currents flowing through the window 1310 in opposite directions, the window 1310 of the magnetic component 13 constitutes a negative coupling inductance. Moreover, when the first winding portion 1321 and the second winding portion 1322 are connected in parallel and the currents flowing through the window 1310 in the same direction, the phase of the magnetic component 13 can be regarded as the same as that of the single window receiving single winding portion, and only the winding set is divided into two paths. Thus, the two winding portions belong to different winding paths, and the connection of the magnetic component 13 and the first substrate 11 can be more flexible.

Figure 26F:
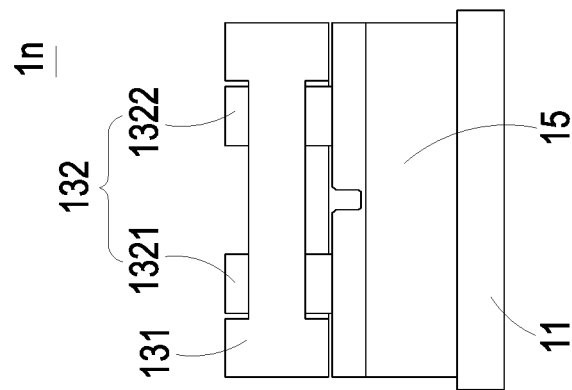
FIG. 26F is a side view illustrating the power module of FIG. 26A.
Figure 26E:
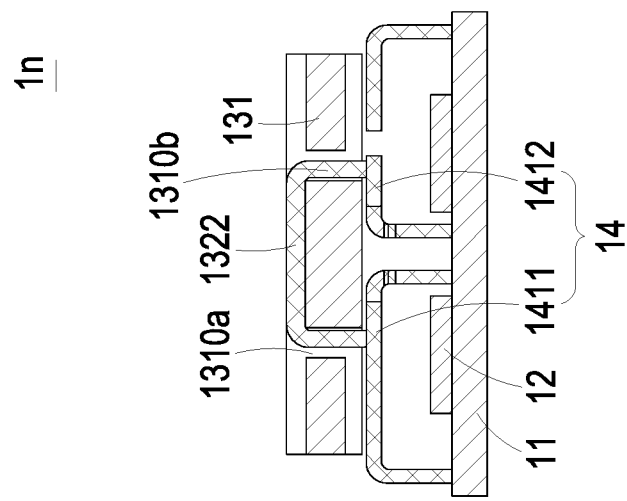
FIG. 26E is a cross-sectional view illustrating the power module and taken along DD line in FIG. 26D.
Figure 26D:
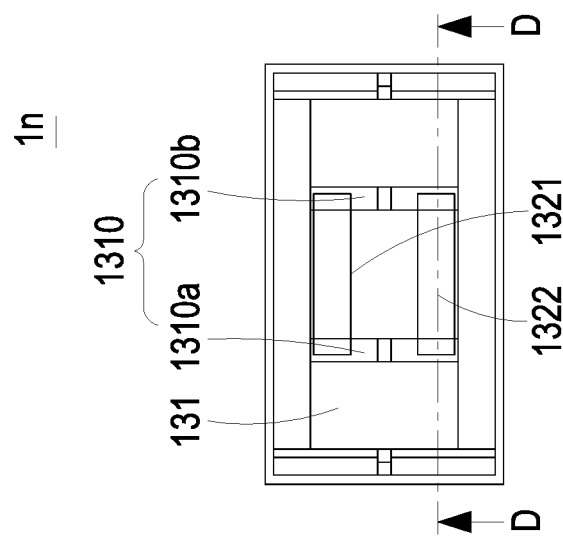
FIG. 26D is a top view illustrating the power module of FIG. 26A.

FIG. 26A is a schematic view illustrating a power module according to a thirteenth preferred embodiment of the present invention, FIG. 26B is a partial 3D view of the power module of FIG. 26A, FIG. 26C is a 3D view illustrating the power module of FIG. 26A, FIG. 26D is a top view illustrating the power module of FIG. 26A, FIG. 26E is a cross-sectional view illustrating the power module and taken along CC line in FIG. 26D, and FIG. 26F is a side view illustrating the power module of FIG. 26A. In the embodiment, the structures, elements and functions of the power module 1n are similar to those of the power module 1f of FIGS. 15 and 16, and are not redundantly described herein. Different from the power module 1f of FIGS. 15 and 16, the power module 1n includes plural winding portions, designated as plural first winding portions 1321 and plural second winding portions 1322. Both of the first winding portion 1321 and the second winding portion 1322 have the first ends accommodated in the same first window 1310a respectively. Both of the first winding portion 1321 and the second winding portion 1322 have the second ends accommodated in another second window 1310b respectively. The conductive component 14 includes plural first conductive portions 1411 and plural second conductive portions 1412. The first conductive portions 1411 are connected to the first substrate 11. The second conductive portions 1412 are opposite to the first conductive portions 1421, disposed on two opposite edges of the first substrate 11 and connected to the first substrate 11. In addition, each first winding portion 1321 is electrically connect with one first conductive portion 1411 and one second conductive portion 1412. Each second winding portion 1322 is connected with one first conductive portion 1411 and one second conductive portion 1412. It is noted that the directions of current flows of the first winding portion 1321 and the second winding portion 1322 are adjustable according to the practical requirements, and can be the same or reversed. The present invention is not limited thereto. On the other hand, the correspondence between the winding set 132 and the window 1310 of the magnetic core 131 is also adjustable according to the practical requirement.

Figure 27:
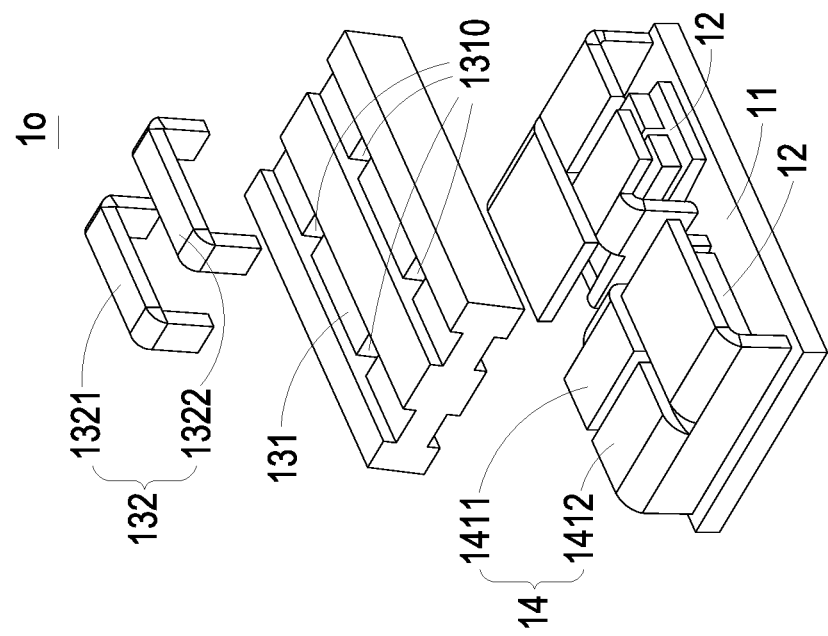
FIG. 27 is a 3D view illustrating a power module according to a fourteenth preferred embodiment of the present invention.

FIG. 27 is a 3D view illustrating a power module according to a fourteenth preferred embodiment of the present invention. In the embodiment, the structures, elements and functions of the power module 1o are similar to those of the power module 1n of FIG. 26, and are not redundantly described herein. Different from the power module 1n of FIG. 26A, the magnetic core of the magnetic component of the power module 1o further includes one or more magnetic cylinder, so as to obtain four divided windows 1310. The winding set 132 of the power module 1o includes a first winding portion 1321 and a second winding portion 1322. The first winding portion 1321 and the second winding portion 1322 have respective first end and respective second end accommodated in different windows 1310, respectively.

Figures 28A, 28B:
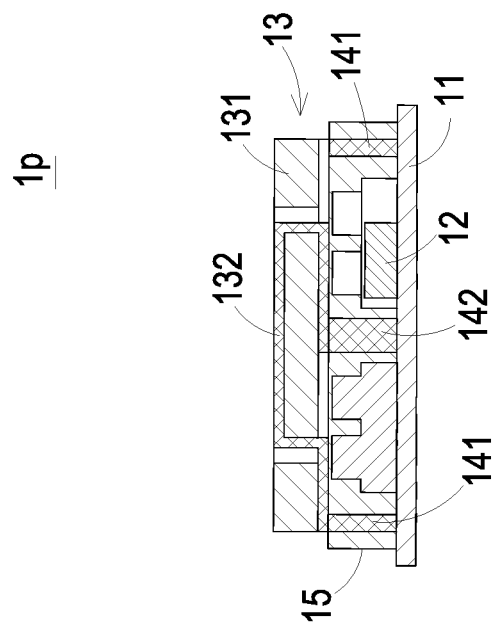
FIG. 28A is a 3D view illustrating a power module according to a fifteenth preferred embodiment of the present invention.
FIG. 28B is a cross-sectional view illustrating the power module and taken along EE line in FIG. 28A.
Figure 28D:
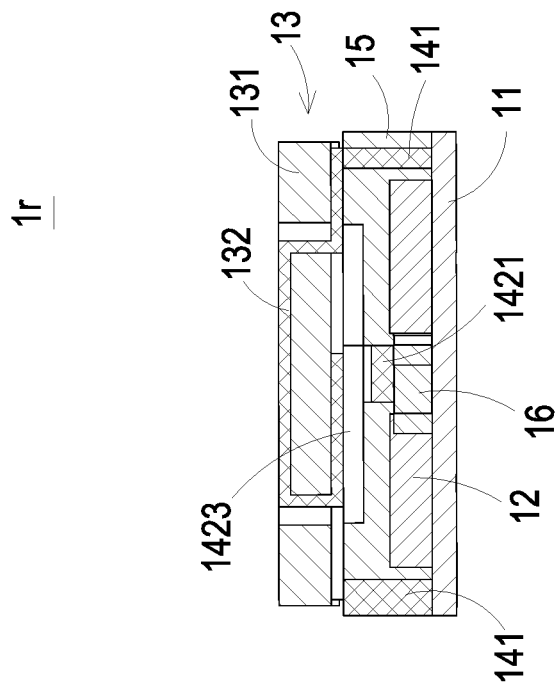
FIG. 28D is a cross-sectional view illustrating the power module taken along FF line in FIG. 28C.
Figure 28C:
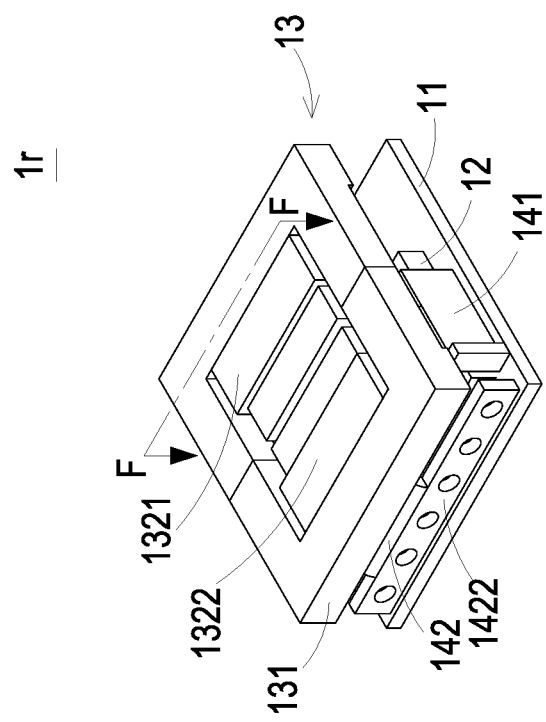
FIG. 28C is a 3D view illustrating a power module according to a sixteenth preferred embodiment of the present invention.
Figure 28E:
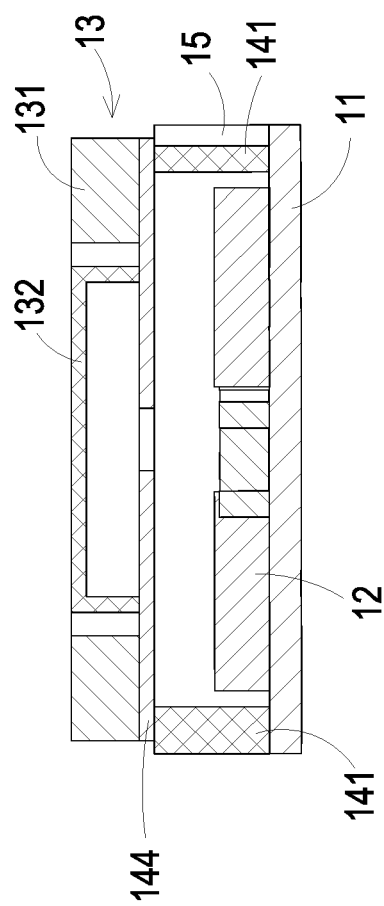
FIG. 28E is another exemplary cross-sectional view illustrating the power module of the sixteenth preferred embodiment of the present invention.
Figure 28G:
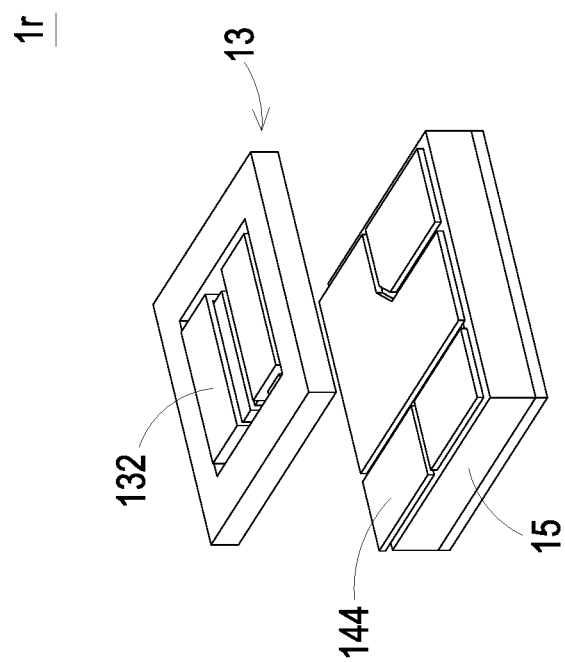
FIG. 28G is another exemplary 3D view illustrating the power module of FIG. 28E.
Figure 28F:
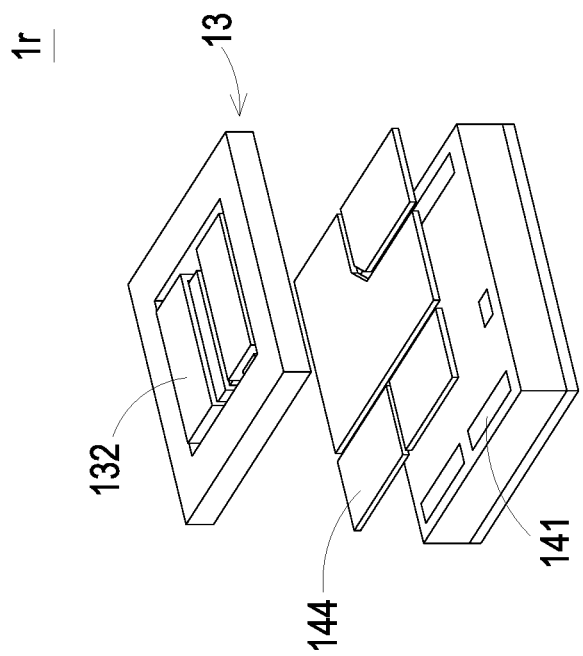
FIG. 28F is a 3D view illustrating the power module of FIG. 28E.

FIGS. 28A and 28B are a 3D view and a cross-sectional view illustrating a power module according to a fifteenth preferred embodiment of the present invention. In the embodiment, the structures, elements and functions of the power module 1p are similar to those of the power module 1f in FIGS. 15 and 16, and are not redundantly described herein. Different from the power module 1f of FIGS. 15 and 16, the power module 1p includes plural winding portions designed as a first winding portion 1321 and a second winding portion 1322. The first end of the first winding portion 1321 and the first end of the second winding portion 1322 are disposed in the same first window 1310a, and the second end of the first winding portion 1321 and the second end of the second winding portion 1322 are disposed in the same second window 1310b. The first winding portion 1321 and the second winding portion 1322 are connected to the first substrate 11 by copper blocks utilized as the conductive portion 141 respectively. In some embodiments, the power module 1p further includes an encapsulation layer 15 (see FIG. 28B), which is disposed on the first substrate 11, covers the power device 12 and the conductive portions 141, and partially exposes the conductive portions 141. Consequently, the power device 12 and other devices disposed on the first substrate 11 are protected, and it facilitates the heat dissipation of the power device 12 and the overall appearance of the power module. FIGS. 28C and 28D are a 3D view and a cross-sectional view of a power module according to a sixteenth preferred embodiment of the present invention. In the embodiment, the structures, elements and functions of the power module 1r are similar to those of the power module 1p in FIGS. 28A and 28B, and are not redundantly described herein. Different from the power module 1p of FIGS. 28A and 28B, the conductive portion 142 of the power module 1r is not constructed by copper blocks, but includes a first leading trace 1421, a second leading trace 1422 and a third leading trace 1423. The third leading trace 1423 is parallel to the first substrate 11 with a space, and other electronic components 16 can be accommodated within the space. Consequently, the other electronic component 16 can be closer to the power device 12 to reduce the electrical connection distance. The third leading trace 1423 is connected to the winding portion 132 of the magnetic component 13, and is connected to the first substrate 11 through the first leading trace 1421 and the second leading trace 1422. The power module 1r further includes an encapsulation layer 15 (see 28D) disposed on the first substrate 11, and it is not redundantly described herein. In the other embodiment, as shown in FIG. 28E, the power module 1r includes a conductive body 144 disposed between the magnetic component 13 and the conductive portions 141. The conductive body 144 can be constructed by a leadframe, as shown in FIG. 28F. Alternatively, the conductive body 144 can be constructed by electroplating directly on the top surface of encapsulation layer 15 with the power device 12 encapsulated therein and then etching, as shown in FIG. 28G. The use of the conductive body 144 facilitates to get rid of the limitation of the corresponding position of the magnetic component 13 and the conductive portions 141, thereby facilitating the optimal arrangement and design of the power module. Furthermore, the winding set 132 can be simplified. As shown in FIG. 28E, the winding set 132 is simplified to a U shape. The two ends of the U-shaped winding set 132 are connected to the conductive body 144, respectively. In addition, it facilitates to accomplish the electromagnetic shielding of the magnetic component 13 and the electronic device (e.g., the power device 12) and also facilitates to achieve the diffusion and conduction of heat.

Figure 29A:
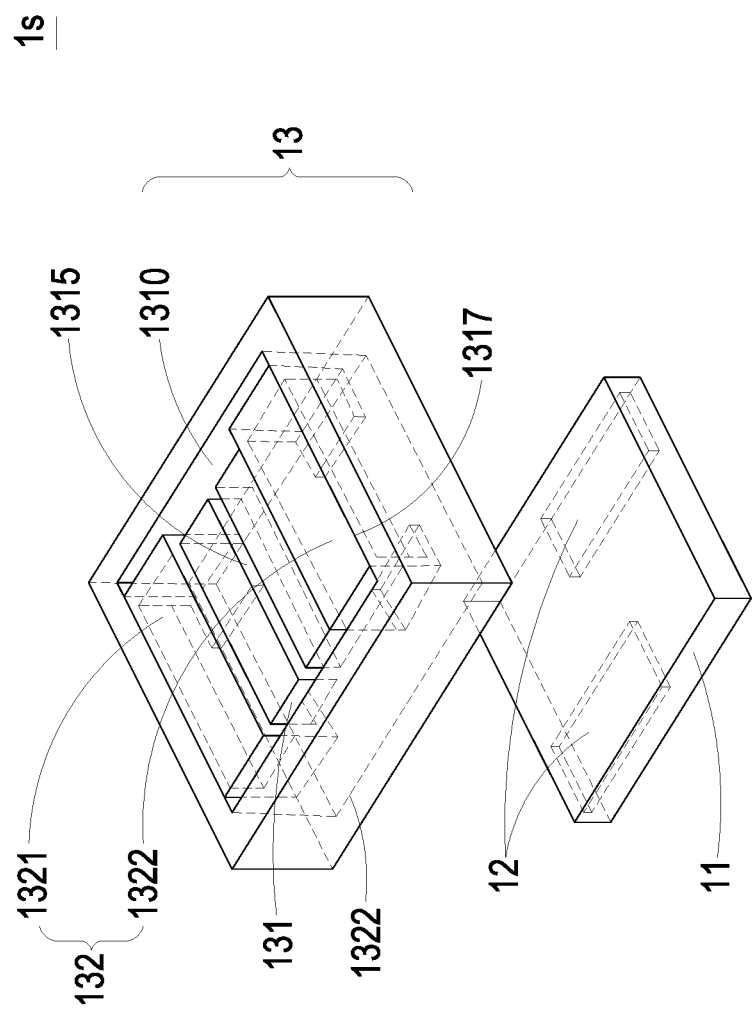
FIG. 29A is a schematic view illustrating a power module according to a seventeenth preferred embodiment of the present invention.
Figure 29B:
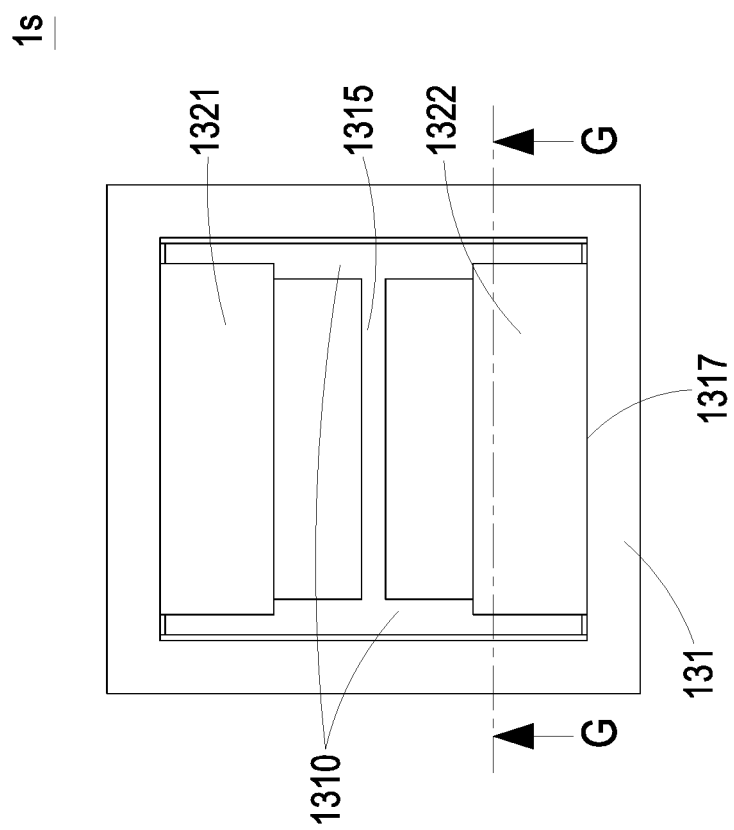
FIG. 29B is a top view illustrating the power module of FIG. 29A.
Figure 29C:
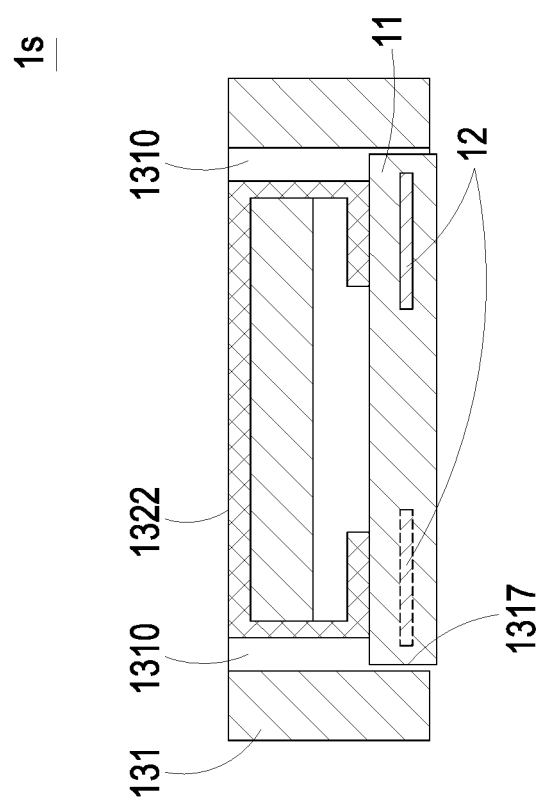
FIG. 29C is a cross-sectional view of the power module and taken along GG line in FIG. 29B.
Figure 29D:
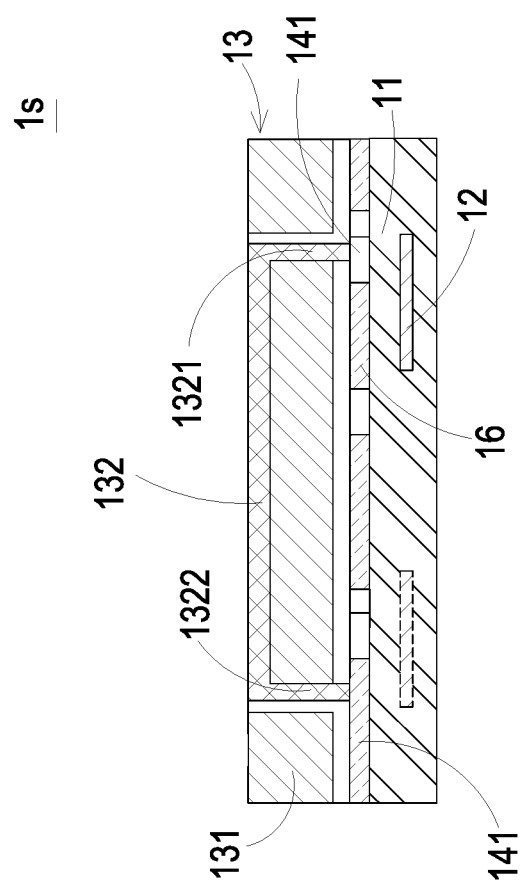
FIG. 29D is a cross-sectional view of another power module according to the seventeenth preferred embodiment of the present invention.

FIG. 29A is a schematic view illustrating a power module according to a seventeenth preferred embodiment of the present invention, FIG. 29B is a top view illustrating the power module of FIG. 29A, and FIG. 29C is a cross-sectional view of the power module and taken along FF line in FIG. 29B. In the embodiment, the structures, elements and functions of the power module 1s are similar to those of the power module 1n in FIG. 26A, and are not redundantly described herein. Different from the power module 1n of FIG. 26A, the magnetic core 131 of the power module 1s includes an air gap 1315 disposed between the windows 1310. The power device 12 is an embedded power chip die, which is embedded in the first substrate 11. The magnetic core 131 further includes at least one accommodation recess 1317 disposed on the first surface 1311 or the second surface 1312 of the magnetic core 131, so that the side walls of the magnetic core 131 are higher than the central area and the winding set 132 or the first substrate 11 is accommodated in the accommodation recess 1317 to form relatively flat upper surface and lower surface. By adjusting the corresponding relationships of the magnetic core 131, the winding set 132 and the window 1310 of the magnetic component 13, the design of the power module of the present embodiment can be more flexible, and the most suitable power module can be provided according to different requirements of products. As described in the foregoing embodiments, the power modules of the present invention have design flexibility and can meet the requirements of different products. FIG. 29D is a cross-sectional view of another power module according to the seventeenth preferred embodiment of the present invention, where the side walls of the magnetic core 131 is not higher than the central region. The magnetic component 13 does not have the accommodation recess 1317 and is integrally stacked on the first substrate 11 having the embedded power device 12. In FIG. 29D, the conductive portion 141 can be omitted. Namely, the first winding portion 1321 and the second winding portion 1322 of the magnetic component 13 are extended downwardly and directly connected to the first substrate 11. The first winding portion 1321 and the second winding portion 1322 are electrically connected to the pads (not shown) disposed on the bottom surface of the power device 12 or the first substrate 11 by the leading trace and via of the first substrate 11. This makes it easier to implement the production of the first substrate 11 by means of joint substrates. The efficiency of manufacturing the power module is improved.

Figure 30:
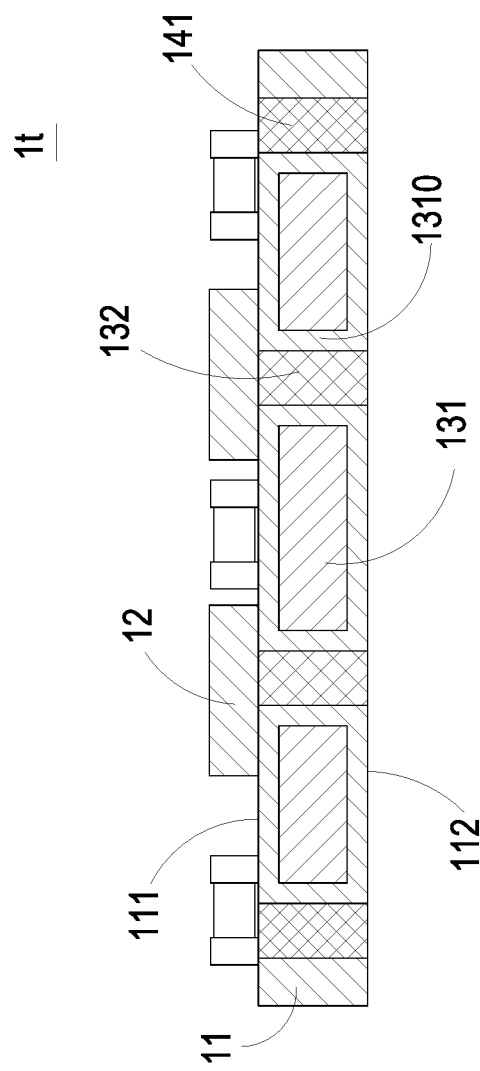
FIG. 30 is a cross-sectional view illustrating a power module according to an eighteenth preferred embodiment of the present invention.
Figure 31:
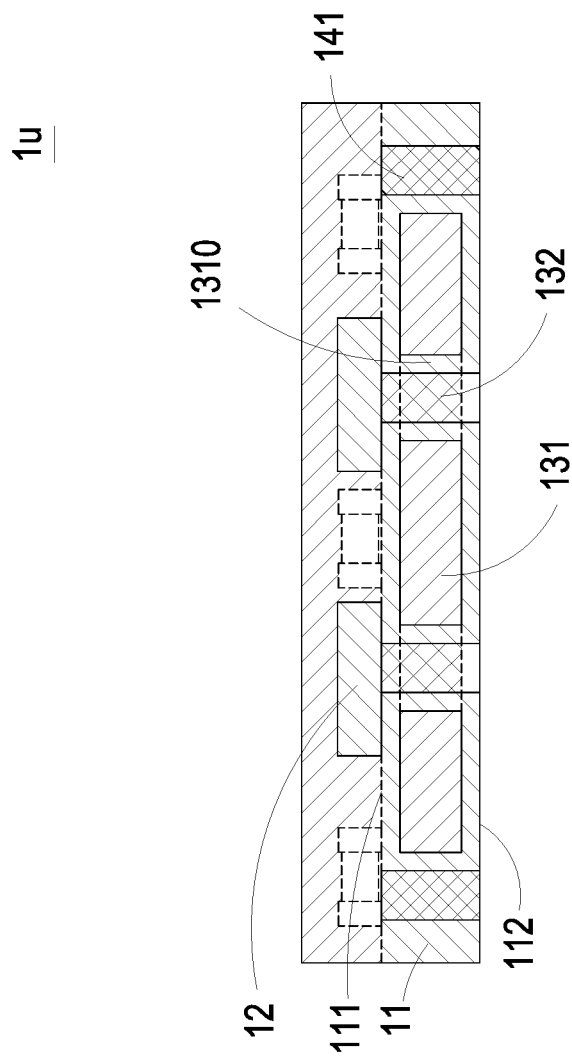
FIG. 31 is a cross-sectional view illustrating a power module according to a nineteenth preferred embodiment of the present invention.

FIG. 30 is a cross-sectional view illustrating a power module according to an eighteenth preferred embodiment of the present invention. In the embodiment, the magnetic component 13 is embedded in the first substrate 11. Namely, a magnetic core 131 is embedded in the first substrate 11, and a winding set 132 and a conductive portion 141 are formed by a conductive material (e.g., copper block) or a leadframe embedded in the first substrate 11. The winding set 132 passes through the window 1310 of the magnetic core 131. The window 1310 of the magnetic core 131 has a passing-through direction vertical to a plane of the power device 12, where at least one leading pin or pad are disposed on the plane. In the embodiment, the power device 12 is deposed on the third surface 111 of the first substrate 11. The power device 12 and other devices can be encapsulated by means of molding (not shown) to enhance the properties of protection, the heat dissipation, and aesthetic appearance. The power module 1t includes an input and output pin (not shown) disposed on the fourth surface 112 of the first substrate 11, and the winding set 132 and the conductive portion 141 are electrically connected with the corresponding input and output pin. FIG. 31 is a cross-sectional view illustrating a power module according to a nineteenth preferred embodiment of the present invention. Similarly, the magnetic component 13 is embedded in the first substrate 11. The winding set 132 and the conductive portion 141 are formed by a conductive material (e.g., copper block) or a leadframe embedded in the first substrate 11. The winding set 132 passes through the window 1310 of the magnetic core 131. a vertical projection of the window 1310 of the magnetic core 131 is partially overlapping with the power device 12. In the embodiment, the power device 12 is embedded in the first substrate 11. The power module 1u further includes an input and output pin (not shown) disposed on the third surface 111 and the fourth surface 112 of the first substrate 11. The winding set 132 and the conductive portion 141 are electrically connected to the corresponding input and output pin. It is obvious that the power module of the present invention has design flexibility and meets the requirements of different products.

Figure 32:
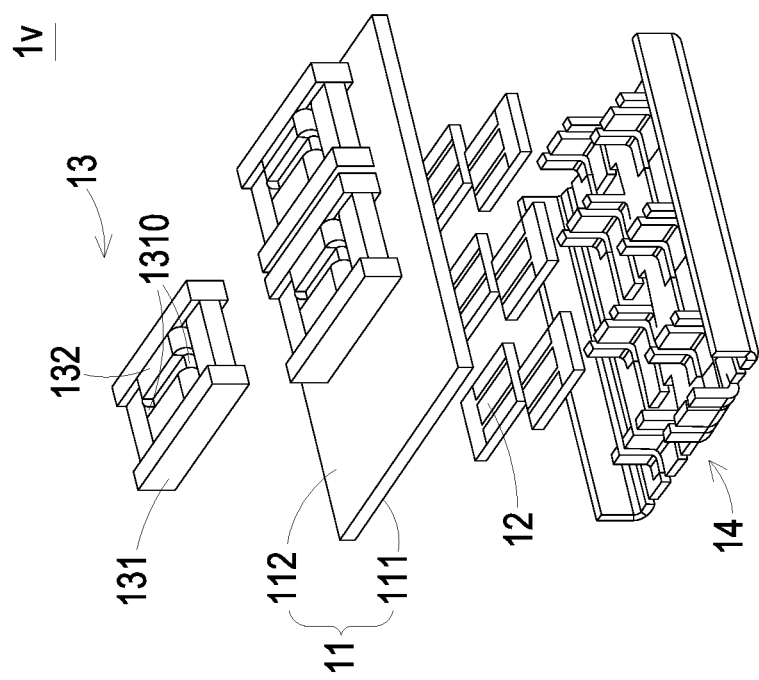
FIG. 32 is a 3D view illustrating a power module according to a twentieth preferred embodiment of the present invention.
Figures 33A, 33B, 33C:
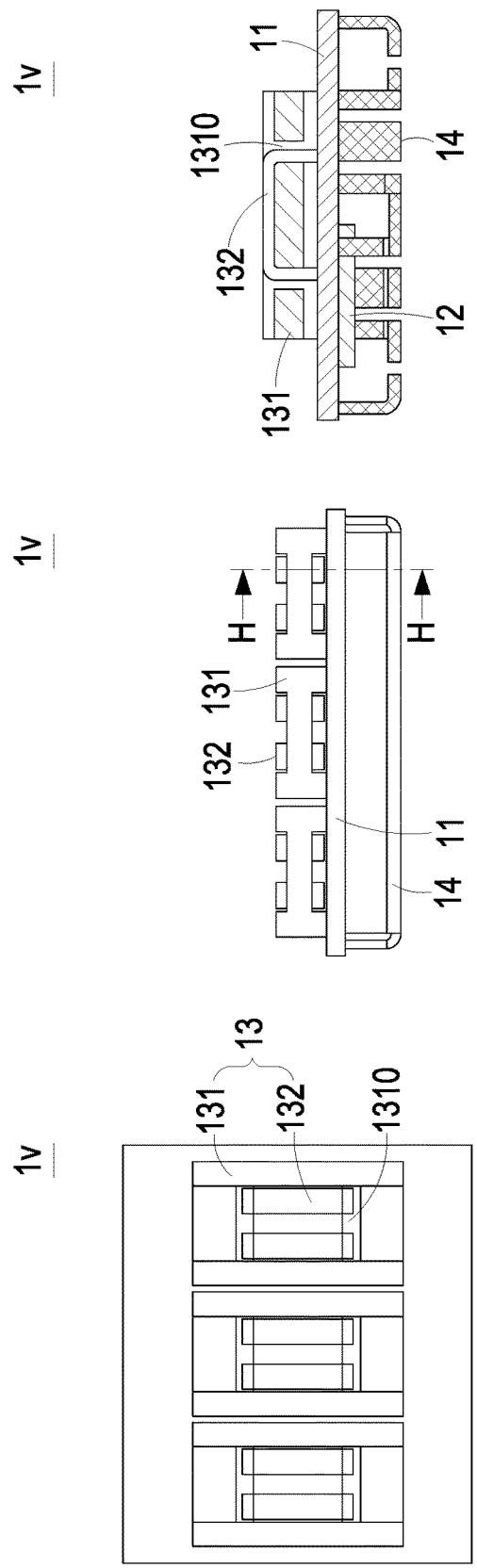
FIG. 33A is a top view illustrating the assembled power module of FIG. 32.
FIG. 33B is a side view illustrating the assembled power module of FIG. 32.
FIG. 33C is a cross-sectional view illustrating the power module and taken along the HH line in FIG. 30B.

FIG. 32 is a 3D view illustrating a power module according to a twentieth preferred embodiment of the present invention, FIG. 33A is a top view illustrating the assembled power module of FIG. 32, FIG. 33B is a side view illustrating the assembled power module of FIG. 32, and FIG. 33C is a cross-sectional view illustrating the power module and taken along the HH line in FIG. 33B. In the embodiment, the structures, elements and functions of the power module 1v are similar to those of the power module 1b of FIGS. 7 and 8, and are not redundantly described herein. Comparing to the forgoing embodiments, the power module 1v includes plural power devices 12 and plural magnetic components 13. The power devices 12 are arranged and disposed on the third surface 111 of the first substrate 11. The magnetic components 13 are corresponding to the power devices 12 and disposed on the fourth surface 112 of the first substrate 11. The conductive component 14 is correspondingly disposed over the power devices 12 and electrically connected to the first substrate 11, so as to form the power module 1v. It is noted that the first substrates 11, the power devices 12 and the conductive components 14 of the aforementioned power modules 1s, 1t, 1u and 1v can be the same. By adjusting the corresponding relationships of the magnetic core 131, the winding set 132 and the window 1310 of the magnetic component 13, the power modules of the present invention can be designed more flexibly and the most suitable power module is provided to meet the requirements of different products.

FIG. 34A is a schematic view illustrating a power module according to a twenty-first preferred embodiment of the present invention, and FIG. 34B is a bottom view illustrating the power module of FIG. 34A. In the embodiment, the structures, elements and functions of the power module 1w are similar to those of the power module 1 of FIGS. 1 and 2, and are not redundantly described herein. Different from the power module 1 of FIGS. 1 and 2, the power module 1w of the present embodiment further includes a first rigid carrier board 17, a flexible carrier board 18, a second rigid carrier board 27, and at least one electronic component 16. The rigid carrier board 17 is disposed below the conductive component 14 and corresponding to the first substrate 11. The flexible carrier board 18 is connected to the rigid carrier board 17 and the first substrate 11. The second rigid carrier board 27 is disposed on the flexible carrier board 18, and the electronic component 16 is disposed on the second rigid carrier board 27. In an embodiment, the electronic component 16 is disposed directly on the flexible carrier board 18, but it is not limited thereto. In addition, the first rigid carrier board 17 and the conductive portion 141 of the conductive component 14 are coplanar. Consequently, the diversified power circuit of the power module 1v is more flexible. The electronic component 16 can be added in the power module under a minimum required volume so as to provide the power module with high power density. FIG. 35A is a 3D view illustrating a power module according to another modification of the twenty-first preferred embodiment of the present invention, and FIG. 35B is a bottom view illustrating the power module of FIG. 35A. In the embodiment, the first rigid carrier board 17 of the power module 1w further covers the conductive portion 141 of the conductive component 14, and the conductive portion 141 of the conductive component 14 and the first joint part 1323 of the winding set 132 are connected to the corresponding pads on the bottom surface of the first rigid carrier board 17 through the first rigid carrier board 17, respectively, so that the co-planarity of the signal pins and power pins of the power module 1w can be achieved more easily.

Figure 36A:
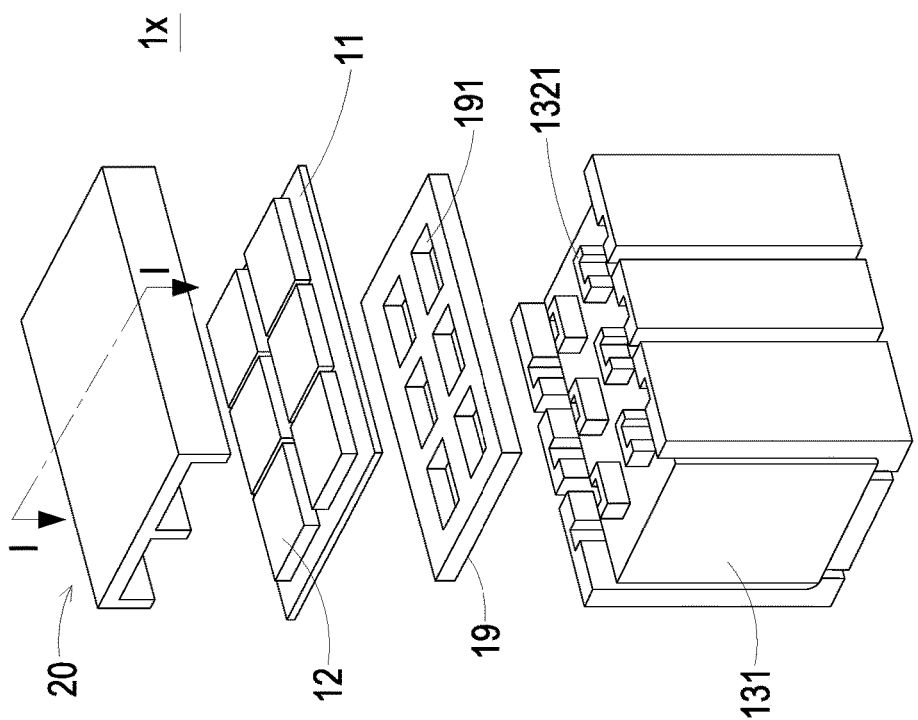
FIG. 36A is a 3D view illustrating a power module according to a twenty-second preferred embodiment of the present invention.
Figure 36C:
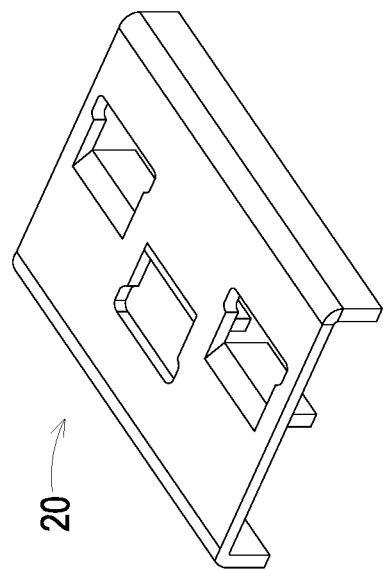
FIG. 36C is a schematic view illustrating a variety example of the second bus bar in the power module of FIG. 36A.
Figure 36B:
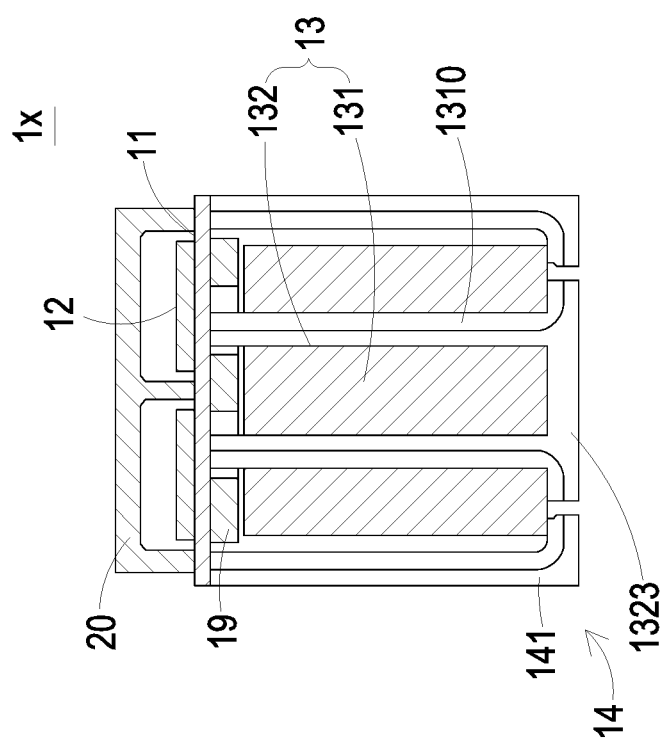
FIG. 36B is a cross-sectional view illustrating the power module and taken along the II line in FIG. 36A.

FIG. 36A is a 3D view illustrating a power module according to a twenty-second preferred embodiment of the present invention, and FIG. 36B is a cross-sectional view illustrating the power module and taken along the HH line in FIG. 36A. In the embodiment, the structures, elements and functions of the power module 1x are similar to those of the power module 1 of FIGS. 1 and 2, and are not redundantly described herein. Different from the power module 1 of FIGS. 1 and 2, the power module 1x further includes a first bus bar 19 disposed between the magnetic core 131 and the first substrate 11 and electrically connected to the first substrate 11. The first bus bar 19 includes plural vias 191, and the first winding portions 1321 pass through the vias 191 correspondingly. The power module 1x further includes a second bus bar 20 disposed above the power device 12 and electrically connected with the first substrate 11, so as to improve the conductive capacity and heat dissipation capacity of the first substrate 11, and avoid the interference and provide the power module with high power density and better quality. Preferably but not exclusively, the first bus bar 19 and the second bus bar 20 are a copper bars. The power module 1x further includes a heat sink disposed on the second bus bar 20 for providing the power module 1w with a heat dissipation path. FIG. 36C is a schematic view illustrating a variety example of the second bus bar in the power module of FIG. 36A. In the embodiment, the second bus bar 20 is made by stamping a metal sheet directly. Alternatively, the second bus bar 20 is formed by metal injection molding without affecting its performance. The present invention is not limited thereto and not redundantly described herein.

Figure 38:
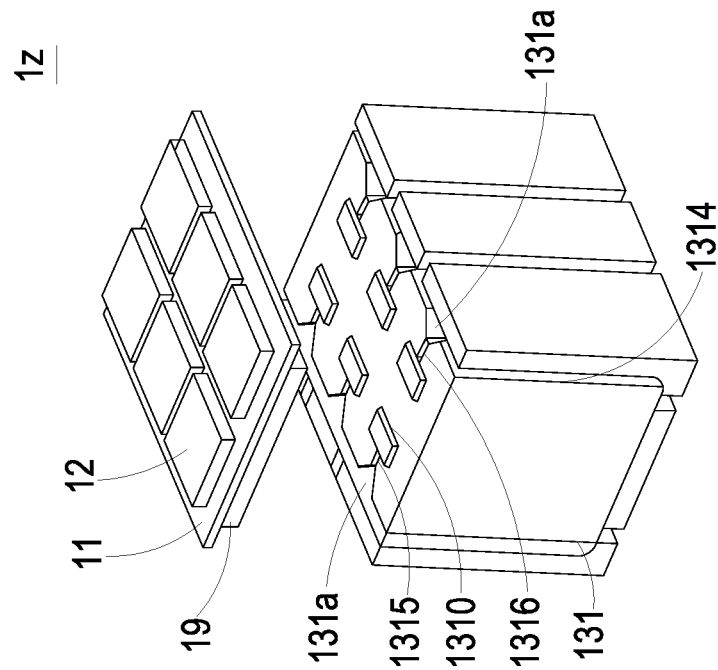
FIG. 38 is a 3D view illustrating a power module according to a twenty-fourth preferred embodiment of the present invention.
Figure 37:
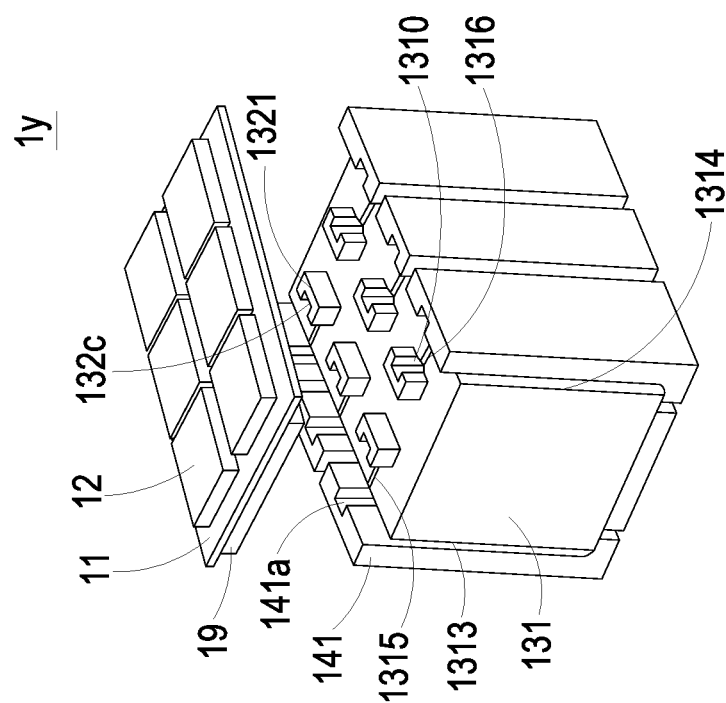
FIG. 37 is a 3D view illustrating a power module according to a twenty-third preferred embodiment of the present invention.

FIG. 37 is a 3D view illustrating a power module according to a twenty-third preferred embodiment of the present invention. In the embodiment, the structures, elements and functions of the power module 1y are similar to those of the power module 1 in FIGS. 1 and 2, and are not redundantly described herein. Different from the power module 1 of FIGS. 1 and 2, the magnetic core 131 of the power module 1y further includes plural first air gaps 1315 and plural second air gaps 1316. Each first air gap 1315 is formed in the first side wall 1313 and in communication with the corresponding window 1310. Each second air gap 1316 is formed in the second sidewall 1314 and in communication with the corresponding window 1310. The first winding portion 1321 include a groove 132c corresponding to the first air gap 1315 or the second air gap 1316, and the conductive portion 141 includes a groove 141a corresponding to the first air gap 1315 or the second air gap 1316. The grooves 132a and the grooves 141a are opposite to each other through the first air gap 1315 or the second air gap 1316 so as to accomplish the effect of avoiding air gap. FIG. 38 is a 3D view illustrating a power module according to a twenty-fourth preferred embodiment of the present invention. In this embodiment, each first air gap 1315 and each second air gaps 1316 of the magnetic core 131 of the power module 1z respectively include a chamfer 131a formed thereon and adjacent to the side of the conductive component, so as to achieve the effect of avoiding the air gap in another way. The chamfer 131a allows the magnetic field of the magnetic core 131 to pass through the first air gap 1315 or the second air gap 1316 while the power is not at full loading and only a small amount of magnetic flux flows through the chamfer 131a. Alternatively, only when the magnetic flux of the air gap 1315 is saturated, a large amount of magnetic flux will flow through the chamfer 131a. With the combination of the above-mentioned application of air gap avoiding, it is more advantageous for the power module of the present invention to accomplish a more compact magnetic component and achieve a power module with high power density.

Figure 39D:
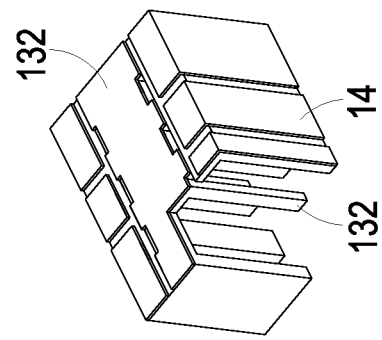
FIGS. 39A to 39D are schematic views illustrating a preforming process of the winding set and the conductive component.
Figure 39C:
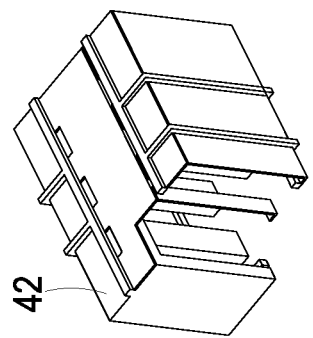
Figure 39B:
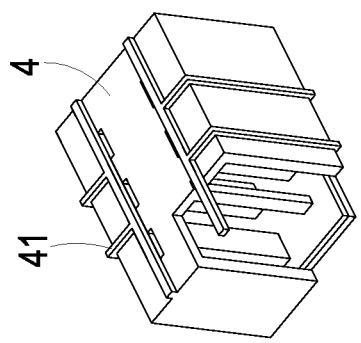
Figure 39A:
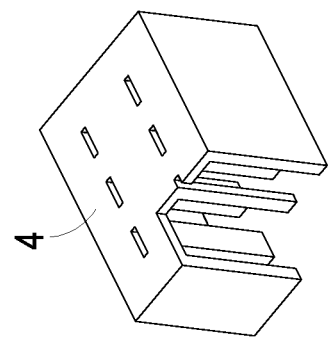

FIGS. 39A to 39D are schematic views illustrating a preforming process of the winding set and the conductive component. As shown in FIG. 39A, a preformed insulation frame 4 is provided firstly. Secondly, at least one removable strip 41 is formed on the insulation frame 4, as shown in FIG. 39B. Then, the insulation frame 4 and the removable strip 41 are subjected to surface plating to obtain a preformed conductive frame 42, as shown in FIG. 39C. Finally, as shown in FIG. 39D, the removable strip 41 is removed such that the previously preformed conductive frame 42 forms the winding set 132 and conductive component 14 required for the power module 1 of the embodiment of FIG. 1. It is noted that the formation of the conductive component 14 and the winding set 132 is only partially exemplified in the present invention, and the formation of the conductive component 14 and the winding set 132 of the power module 1 is not limited thereto.

Figure 40A:
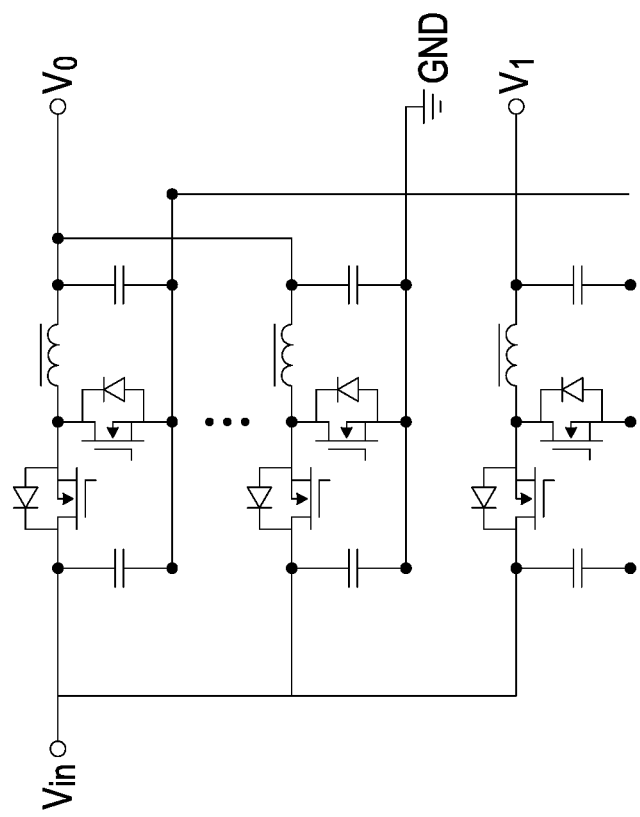
FIGS. 40A to 40C are circuit diagrams illustrating the application of a power module according to three embodiments of the present invention.
Figure 40B:
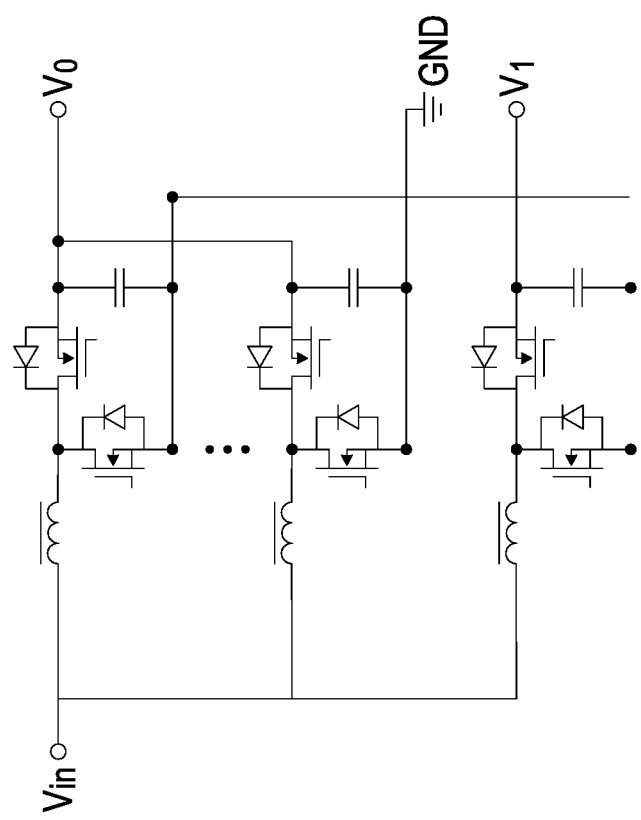
Figure 40C:
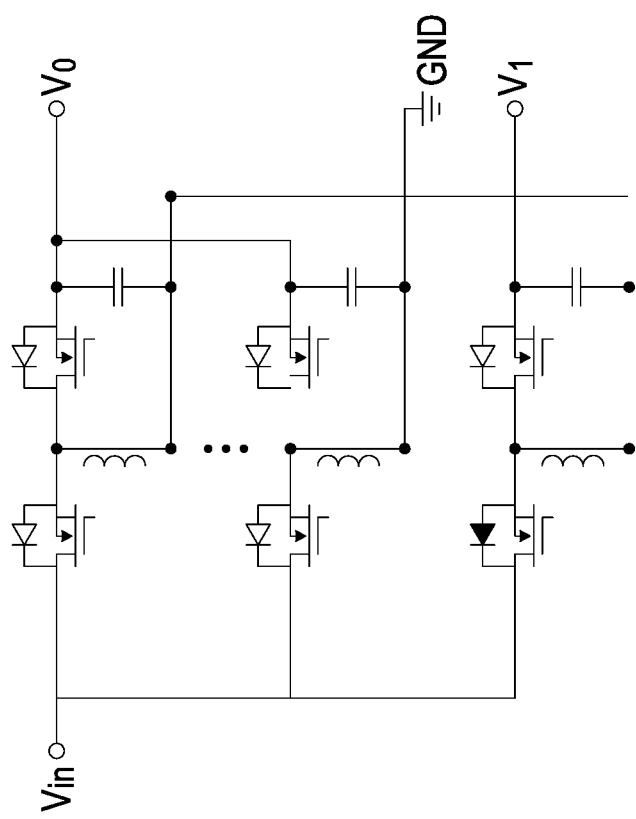

FIGS. 40A to 40C are circuit diagrams illustrating the application of a power module according to three embodiments of the present invention. FIG. 40A illustrates a Buck circuit. FIG. 40B illustrates a Boost circuit. FIG. 40C illustrates a Buck/Boost circuit. It is noted that the power module 1 of the present invention can be applied to the circuit topology shown in FIGS. 40A to 40C, so that different circuit constructions can be applied between the input voltage Vin and the output voltages $V_o$ and $V_1$. In the power module 1 of the present invention, the power device 12 and the magnetic component 13 can be selected and arranged flexibly, so as to provide the most suitable power module meeting the requirements of different product. The practical selections and the distribution are not redundantly described herein.

In summary, the present disclosure provides a power module and a magnetic component thereof. The magnetic component and the power device of the power module are stacked together, and the magnetic component has a window passing through the top surface and the bottom surface of the magnetic core. The vertical projection of the top surface and the bottom surface at least partially overlaps with the power device. Consequently, the magnetic component and the power device can be stacked together and assembled with the shortest connecting trace, so as to reduce the entire volume of the power module, increase the power density, and provide a competitive power module having high conversion efficiency. In addition, the magnetic component of the power module includes at least two integrated windings, which pass through the widow of the magnetic core and are electrically connected to the power device with the short connecting distance, wherein the power device is located at the vertical projection of the magnetic core and stacked together with the magnetic component. Each end of the multiple-turn windings is connected to a joint part used as an input and output terminal of the power module, so that the winding and the conductive body of the power module can be preformed to simplify the manufacturing process and reduce the production cost.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A power module comprising:
a power device; and
a magnetic component, stacked with the power device, wherein a vertical projection of the magnetic component is at least partially overlapping with the power device, and the magnetic component comprises:
a magnetic core, including a first surface, a second surface and at least one window, wherein the first surface is opposite to the second surface, the at least one window is located between the first surface and the second surface, and the window passes through the magnetic core and a passing-through axis of the window is vertical to a surface of the power device, wherein at least one leading pin or pad is disposed on the surface of the power device; and
at least one winding set, including at least one winding portion, wherein the at least one winding portion passes through the at least one window and electrically connected to the power device, each winding set and the magnetic core are configured to form an inductor, and the winding set is preformed.

2. The power module according to claim 1, wherein the magnetic core comprises a first lateral wall and a second lateral wall, and the first lateral wall and the second lateral wall are opposite to each other, wherein the winding set comprises plural winding portions and at least one first joint part, and the at least one first joint part is connected to plural first ends of at least part of the winding portions and extended along the first surface, the second surface, the first lateral wall or the second lateral wall of the magnetic core.

3. The power module according to claim 2, wherein the magnetic component comprises at least two winding sets, the at least two winding sets and the magnetic core are configured to form at least two inductors, wherein the at least two inductors comprise a joint part disposed at an electromagnetic loop thereof.

4. The power module according to claim 3, further comprising a first substrate including a third surface and a fourth surface, wherein the power device is disposed on the third surface or the fourth surface of the first substrate.

5. The power module according to claim 4, wherein the power device and the magnetic component are disposed on the third surface and the fourth surface of the first substrate respectively.

6. The power module according to claim 5, further comprising a conductive component, wherein the conductive component comprises:
plural conductive portions, wherein each conductive portion comprises a first end connected to the power device by the first substrate, and each conductive portion extends along one lateral wall of the magnetic core and partially along a surface of the magnetic core having the first joint part located thereat,
wherein the first joint part and portion of the conductive portions are electrically connected to an external circuit.

7. The power module according to claim 5, further comprising a conductive component, wherein the conductive component comprises:
plural first leading traces electrically connected to the power device;
a second joint part electrically connected to the first leading traces; and
plural conductive portions, wherein each conductive portion includes a first end connected with the first substrate, wherein the second joint part and the conductive portions form an accommodation trough, the power device is accommodated in the accommodation trough, and the second joint part and portion of the conductive portions can be electrically connected to an external circuit.

8. The power module according to claim 5, wherein the magnetic component further comprises a division plate disposed on the first surface or the second surface of the magnetic core.

9. The power module according to claim 4, wherein the power device and the magnetic component are disposed on the same surface of the first substrate, and the power device is disposed between the magnetic core and the first substrate.

10. The power module according to claim 9, wherein the first substrate comprises at least one pad disposed on another surface opposite to the surface where the power device and the magnetic component located thereat, and which can be is electrically connected to an external circuit.

11. The power module according to claim 10, further comprising a conductive component, wherein the conductive component comprises:
plural conductive portions electrically connected with the winding set; and
plural second leading traces, wherein each second leading trace includes a first end electrically connected to the first substrate and the power device is disposed between two of the second leading traces.

12. The power module according to claim 11, wherein the conductive component further comprises:
plural third leading traces, wherein each third leading trace includes a first end electrically connected to the power device, and at least portion of the plural third leading traces are electrically connected to a second joint part of the second leading traces.

13. The power module according to claim 10, wherein the power device comprises at least one top pad and at least one bottom pad disposed on a top surface and a bottom surface of the power device respectively, and the power device is electrically connected to the first substrate by the at least one bottom pad and electrically connected to the winding portions of the winding set by the at least one top pad.

14. The power module according to claim 1, further comprising a first substrate, wherein the power device is embedded in the first substrate.

15. The power module according to claim 14, further comprises at least one electronic component disposed on the first substrate.

16. The power module according to claim 4, wherein the power module further comprising a second substrate, and the first substrate and the magnetic components are disposed on two opposite surfaces of the second substrate respectively, the power device is disposed on the first substrate and electrically connected to the first substrate, and the first substrate is disposed between the power device and the second substrate.

17. The power module according to claim 1, wherein the at least one window is accommodated with at least two of the winding portions, wherein the at least two winding portions belong to different winding sets, and the at least two winding portions are connected in series or in parallel.

18. The power module according to claim 1, wherein the at least one window is accommodated with at least two of the winding portions, wherein the at least two winding portions belong to different winding sets and have currents flowing through the at least one window in opposite directions.

19. The power module according to claim 1, wherein at least one of the winding portions comprises two ends passing through two different windows of the plural windows respectively.

20. The power module according to claim 1, further comprising a first substrate, wherein the magnetic component is embedded in the first substrate.

21. The power module according to claim 1, further comprising a first substrate, wherein the magnetic core further comprises an accommodation recess disposed on the first surface or the second surface and configured to accommodate the first substrate.

22. The power module according to claim 6, wherein the conductive component is preformed.

23. The power module according to claim 4, further comprising:
a first rigid carrier board disposed on a surface of the magnetic core including another opposite surface having the first substrate located thereat; and
a flexible carrier board disposed on one lateral wall of the magnetic core and connected to the first rigid carrier board and the first substrate.

24. The power module according to claim 23, further comprising:
a second rigid carrier board disposed on the flexible carrier board; and
at least one electronic component disposed on the flexible carrier board or the second rigid carrier board.

25. The power module according to claim 4, further comprising a first bus bar disposed between the magnetic core and the first substrate, wherein the first bus bar comprises plural vias, wherein the winding portions are corresponding to and pass through the vias.

26. The power module according to claim 4, further comprising a second bus bar disposed on the power device and electrically connected to the first substrate, wherein the power device is disposed between the second bus bar and the first substrate.

27. The power module according to claim 6, wherein the magnetic core further comprises:
plural air gaps formed on one of the lateral walls of the magnetic core and in communication with the corresponding window.

28. The power module according to claim 27, wherein the winding portion or the conductive component further comprise a groove disposed thereon and opposite to the air gap.

29. The power module according to claim 27, wherein each of the air gaps comprises a chamfer adjacent to the window or a lateral wall of the magnetic core.

30. The power module according to claim 1, wherein the winding set is preformed by punching a one-piece conductive body, assembling a conductive body with an insulation body or metal-plating on an insulation body.

31. The power module according to claim 1, wherein the magnetic component includes at least one pin connected to a conductive portion or a pin disposed on a top surface of the power device by a conductive body.

32. A magnetic component of a power module, comprising:
a magnetic core, including a first surface, a second surface and at least one window, wherein the first surface is opposite to the second surface, and the at least one window is located between the first surface and the second surface and passes through the magnetic core; and
at least one winding set, including plural winding portions and at least one first joint part, wherein each of the plural winding portions includes a first end and a second end, and the first joint part is connected with all of or a part of the first ends of the plural winding portions and extends along the second surface of the magnetic core so as to make the at least one first joint part serve as a first leading pin or pad of an inductor of the power module, wherein at least one of the plural winding portions passes through the at least one window to make the second end of the at least one of the plural winding portions serve as a second leading pin or pad of the inductor of the power module, wherein the first joint part of the winding set and the plural winding portions are formed in one piece.

33. The magnetic component of the power module according to claim 32, wherein the second ends of the plural winding portions pass through the at least one window and extend along the first surface of the magnetic core.

34. The magnetic component of the power module according to claim 33, wherein the magnetic core comprises a first lateral wall, a second lateral wall and at least one air gap, and the first lateral wall and the second lateral wall are opposite to each other, wherein the air gap is adjacent to a magnetic column of the magnetic core where the second lateral walls located thereat and in communication with the corresponding window, wherein the first joint part and the plural winding portions are extended along the first surface and the second surface of the magnetic core, respectively, and toward the second lateral wall.

35. The magnetic component of the power module according to claim 34, wherein the winding set and the air gap are configured to form an avoidance distance, wherein a window's width and the avoidance distance is ranged from one-eighth of the window width to one-half of the window width.

* * * * *